(12) United States Patent
Kanazawa

(10) Patent No.: US 7,459,707 B2
(45) Date of Patent: Dec. 2, 2008

(54) EXPOSURE APPARATUS, LIGHT SOURCE APPARATUS AND DEVICE FABRICATION

(75) Inventor: Hajime Kanazawa, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 447 days.

(21) Appl. No.: 11/260,934

(22) Filed: Oct. 27, 2005

(65) Prior Publication Data

US 2006/0091328 A1    May 4, 2006

(30) Foreign Application Priority Data

Oct. 28, 2004    (JP)    .............. 2004-313484

(51) Int. Cl.
*H05H 1/24*    (2006.01)
(52) U.S. Cl. ................. 250/504 R; 250/493.1
(58) Field of Classification Search ............. 250/504 R
See application file for complete search history.

(56) References Cited

U.S. PATENT DOCUMENTS 6,324,255 B1    11/2001    Kondo et al.
7,348,582 B2 *   3/2008    Hasegawa ............... 250/504 R

FOREIGN PATENT DOCUMENTS

JP    62-283629    12/1987
JP    2000-56099   2/2000

* cited by examiner

*Primary Examiner*—David A. Vanore
(74) *Attorney, Agent, or Firm*—Morgan & Finnegan, LLP

(57) ABSTRACT

An exposure apparatus for exposing a pattern of a mask onto an object, said exposure apparatus includes a light source for generating a plasma, said light source including a condenser mirror that condenses a light irradiated from the plasma, an illumination optical system for illuminating the mask using the light condensed by the condenser mirror, a detector that is provided between the condenser mirror and the illumination optical system, said detector detecting a property of the light, and a changing part for changing a state of the plasma based on a detected result of the detector.

7 Claims, 22 Drawing Sheets

EXPOSURE APPARATUS, LIGHT SOURCE APPARATUS AND DEVICE FABRICATION

BACKGROUND OF THE INVENTION

The present invention relates generally to an exposure apparatus, and more particularly to a light source apparatus used in an exposure apparatus for exposing an object, such as a single crystal substrate of a semiconductor wafer etc. and a glass plate for a liquid crystal display ("LCD"). The present invention is suitable, for example, for an exposure apparatus that uses an extreme ultraviolet ("EUV") light as a light source for exposure.

Conventionally, the photolithography technology has employed a reduction projection exposure apparatus using a projection optical system to project a circuit pattern of a mask (reticle) onto a wafer, etc., in manufacturing fine semiconductor devices such as a semiconductor memory and a logic circuit.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution. Thus, along with recent demands for finer semiconductor devices, uses of shorter ultraviolet light wavelengths have been proposed—from an ultra-high pressure mercury lamp (I-line with a wavelength of approximately 365 nm) to KrF excimer laser (with a wavelength of approximately 248 nm) and ArF excimer laser (with a wavelength of approximately 193 nm).

However, the lithography using the ultraviolet light has limitations when it comes to satisfying the rapidly promoted fine processing of a semiconductor device. Therefore, a reduction projection optical system using the EUV light with a wavelength of 10 to 15 nm shorter than that of the ultraviolet light (referred to as an "EUV exposure apparatus" hereinafter) has been developed to efficiently transfer very fine circuit patterns of 0.1 μm or less.

The EUV exposure apparatus typically uses a laser plasma light source and a discharge plasma light source as the light source. The laser plasma light source irradiates a laser beam to a target material to generate a plasma and generates the EUV light. The discharge plasma light source generates a plasma by introducing gas to an electrode for discharging and generates the EUV light. The EUV light from the plasma is condensed at a condensing point by a condenser mirror, diverges from the condensing point, and is incident upon a subsequent illumination optical apparatus.

Uniformly illuminating the mask is very important to improve the resolution of the exposure apparatus. Then, a light intensity of the EUV light diverged from the condensing point should be preferably uniform within a divergence angle. However, in the EUV light source operated (used) for a long time, the light intensity of the EUV light that is incident upon the optical system from the condensing point and light intensity distribution within the divergence angle diverged from the condensing point change due to deteriorations of EUV light source's components.

For example, in the laser plasma light source, a nozzle that supplies the target material erodes and deforms by collisions of debris generated from the plasma, and a position of the plasma that generates the EUV light changes. In the discharge plasma light source, the electrode deforms (melts) by the heat from the plasma, and the position of the plasma that generates the EUV light changes. As a result, the light intensity of the EUV light that is incident upon the illumination optical system decreases as a condensing position of the EUV light changes, and the light intensity within the divergence angle diverged from the condensing point displaces from the initial condition.

One proposal detects a generating position of the plasma using a pinhole camera and/or a CCD, controls a target supplying position or a pulsed-laser irradiating position (which is a condensing position of the pulsed-later), and maintains the generating position of the EUV light in place. See, for example, Japanese Patent Applications, Publication Nos. 2000-56099 and 62-283629.

However, the instant inventions have discoursed that the prior art detects only the generating position of the plasma, and it cannot necessarily maintain the light intensity of the EUV light diverged from the condensing point constant within the divergence angle. In other words, the light intensity of the EUV light diverged from the condensing point within the divergence angle depends upon not only by the plasma position but also by other factors, such as a plasma shape, a gas density distribution, and a condenser mirror shape.

For example, the condenser mirror that condenses the EUV light from the plasma on the condensing point lowers its reflectance by the collisions with the debris generated from or near the plasma and by adhesions of contaminations. As a result, the light intensity of the EUV light that is incident upon the illumination optical system may decrease. Moreover, since the condenser mirror does not have a uniformly lowered reflectance occurred on its entire reflective surface, the light intensity distribution within the divergence angle diverged from the condenser point differs from the initial condition. Thus, even with a fixed plasma position, properties of the EUV light fluctuate in the condensing point. Therefore, mere control over the plasma has difficulties in position uniformly illuminating the mask, and deteriorates the performance of the exposure apparatus.

The changes of the properties of the EUV light in the condensing point depend on not only deteriorations of EUV light source's components for a long time use, but also short time or time wise scattering, although a change amount is small. This attributes to temperature changes of the light source, instable supplies of the target material and instable emissions of the laser in the laser plasma light source, and instable supplies of the gas in the discharge plasma light source. These factors similarly deteriorate performance of the exposure apparatus.

BRIEF SUMMARY OF THE INVENTION

Accordingly, the present invention is directed to an exposure apparatus that maintains the properties of EUV light from a plasma, uniformly illuminates a mask, and achieves a superior exposure performance. Here, the properties of EUV light include, for example, a position of a condenser point, a light intensity of EUV light on the condensing point, a light intensity distribution within a divergence angle divergent from the condenser point, and spectrum.

An exposure apparatus according to one aspect of the present invention for exposing a pattern of a mask onto an object, said exposure apparatus includes a light source for generating a plasma, said light source including a condenser mirror that condenses a light irradiated from the plasma, an illumination optical system for illuminating the mask using the light condensed by the condenser mirror, a detector that is provided between the condenser mirror and the illumination optical system, said detector detecting a property of the light, and a changing part for changing a state of the plasma based on a detected result of the detector.

A light source apparatus according to another aspect of the present invention includes a generating part for generating a plasma, a condenser mirror for condensing a light irradiated from the plasma, a chamber for accommodating the generating part and the condenser mirror, and a detector that is accommodated by the chamber, said detector detecting a property of the light on a condensing point of the light.

A device fabrication method according to another aspect of the present invention includes the steps of exposing an object using the above exposure apparatus, and performing a development process for the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
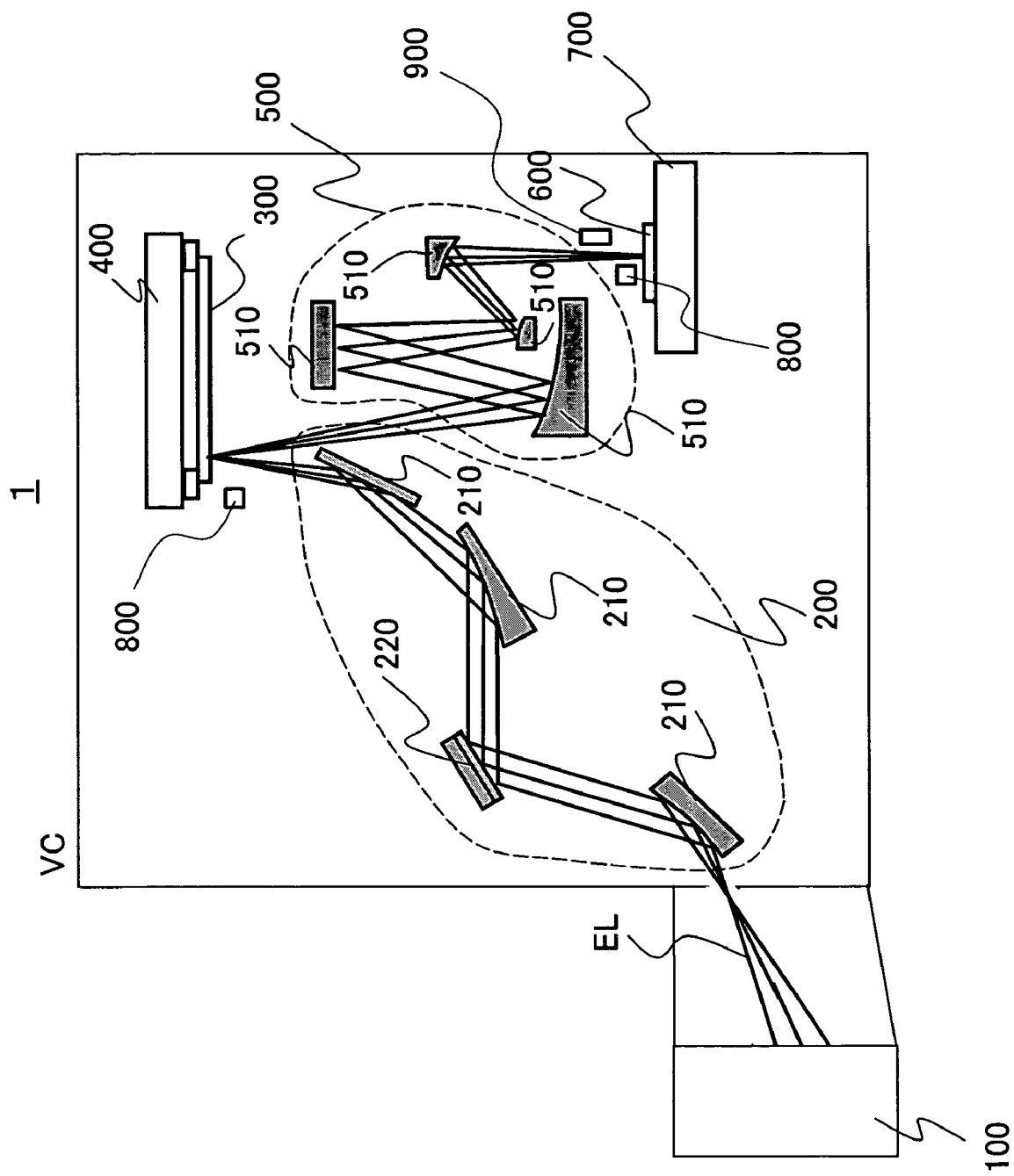
FIG. 1 is a schematic sectional view of an exposure apparatus as one aspect according to the present invention.

With reference to the accompanying drawings, a description will be given of an exposure apparatus as one aspect according to the present invention. In each figure, the same reference numeral denotes the same element. Therefore, duplicate descriptions will be omitted. FIG. 1 is a schematic sectional view of the exposure apparatus 1 according to the present invention.

The exposure apparatus 1 of the present invention uses the EUV light (with a wavelength of, e.g., 13.4 nm) as illumination light for exposure, and exposes onto an object 600 a circuit pattern of a mask 300, for example, in a step-and-scan manner. Of course, the present invention is applicable to a step-and-repeat exposure apparatus ("stepper"). This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat" manner is another mode of exposure method that moves a wafer stepwise to an exposure area for the next shot every shot of cell projection onto the wafer.

Referring to FIG. 1, the exposure apparatus 1 includes an illumination apparatus 100, an illumination optical system 200, a mask stage 400, a projection optical system 500, a wafer stage 700, an alignment detecting mechanism 800, and a focus position detecting mechanism 900. An illumination apparatus includes the light source apparatus 100 and the illumination optical system 200, and illuminates the mask 300 using the EUV light that has a wavelength of, for example, 13.4 nm and an arc shape corresponding to an arc-shaped field of the projection optical system 500.

As shown in FIG. 1, at least the optical path through which the EUV light travels (or the entire optical system) should preferably be maintained in a vacuum atmosphere VC, since the EUV light has low transmittance to the air and causes contaminations as a result of response to components of residual gas (or polymer organic gas).

Figure 2:
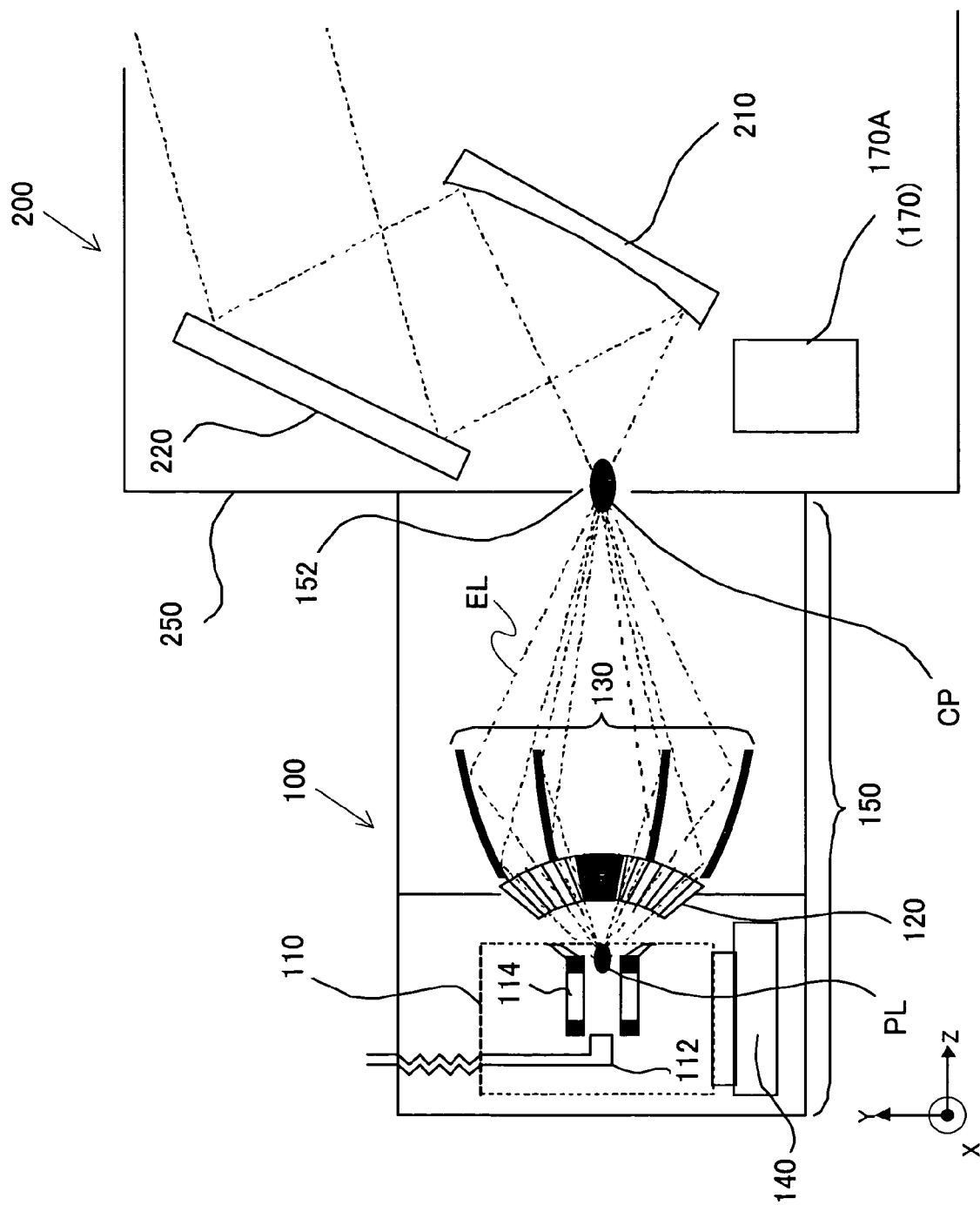
FIG. 2 is a schematic sectional view of a light source apparatus of the exposure apparatus shown in FIG. 1.
Figure 3:
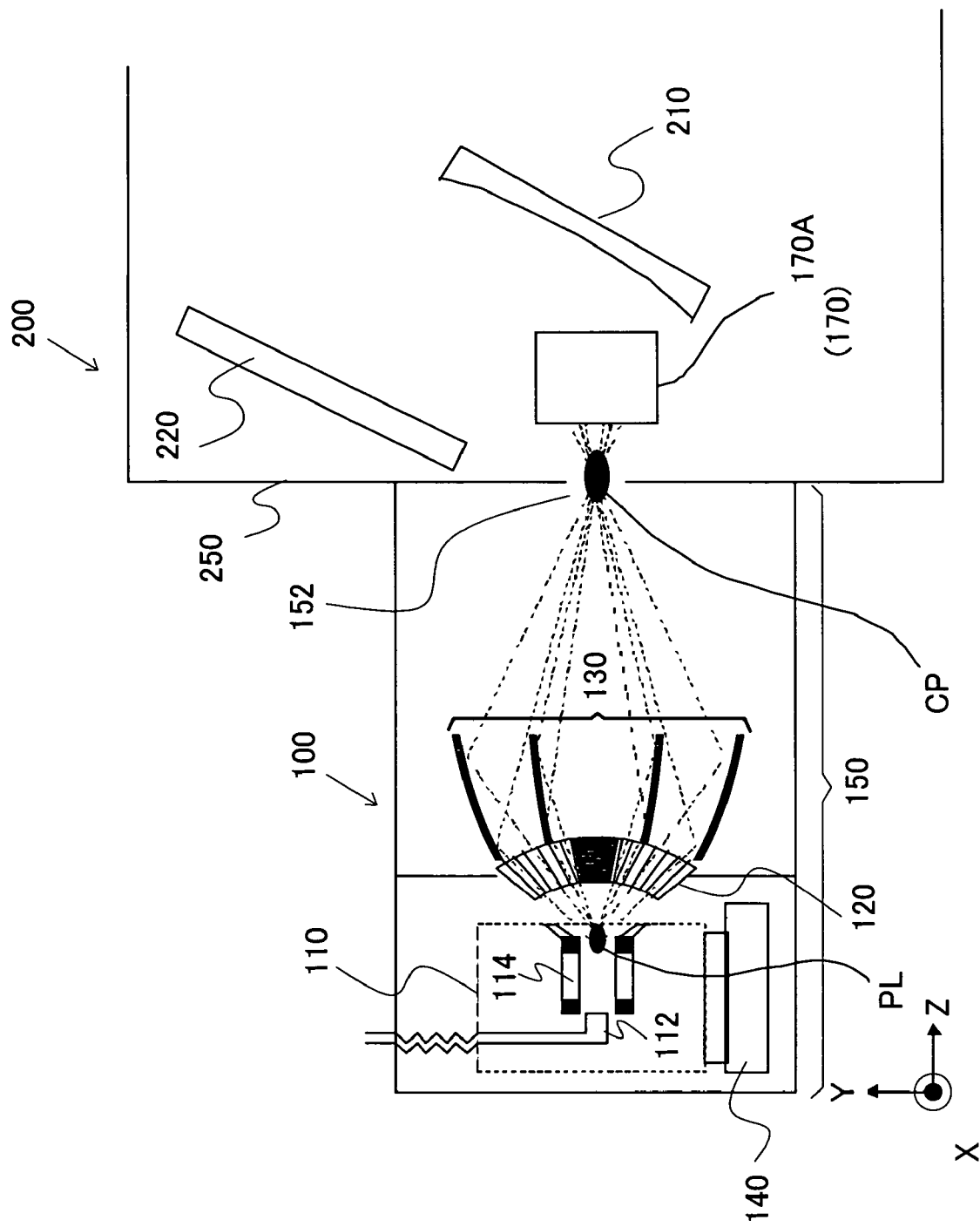
FIG. 3 is a schematic sectional view of a light source apparatus of the exposure apparatus shown in FIG. 1.

The light source apparatus 100 is, in the instant embodiment, a discharge plasma light source and includes, as shown in FIGS. 2 and 3, a generating part 110, a debris filter 120, a condenser mirror 130, a stage 140, a light source chamber 150, and a detector 170. Here, FIGS. 2 and 3 are schematic sectional views of the light source apparatus 100 of the exposure apparatus 1. A coordinate axis hereinafter description sets, as shown in FIGS. 2 and 3, X-axis as a direction perpendicular to the paper, Y-axis as a vertical direction of the paper, and Z-axis as a lateral (right-and-left) direction of the paper.

The generating part 110 generates a discharge by xenon (Xe) gas for instance supplied from a nozzle 112 and a high electric voltage applied to an electrode 114, and generates a plasma PL with high density by a pinch action based on a self-magnetic field of a charged particle flow. The plasma PL generates an EUV light EL.

The generating part 110 is fixed on the stage 140 that is movable in the Z-axis direction. In other words, the generating part 110 is movable in the Z-axis direction by a stage driving source (not shown) that drives the stage 140.

The EUV light EL from the plasma PL passes through the debris filter 120 that removes debris particles, reflects by the condenser mirror 130 that consists of two pairs of mirrors having a spheroid as a reflective surface, and condenses on a condensing point CP. The EUV light EL has a property absorbed by gas. Therefore, the generating part 110, the debris filter 120, the condenser mirror 130 and the stage 140 are accommodated by the light source chamber 150 exhausted by the vacuum exhausting system (not shown) to prevent this absorption.

The EUV light EL condensed on the condensing point CP is introduced into an illumination system chamber 250 that accommodates optical elements of the illumination optical system 200 described later, reflects by an illumination system mirror 210, and then is incident upon an optical integrator 220. Moreover, the EUV light EL uniformly illuminates the mask 300 through the illumination system mirror 210.

The illumination system chamber 250 is exhausted by a vacuum exhausting system (not shown) to prevent the absorption of the EUV light by gas similar to the light source chamber 150. However, although an inside of the light source chamber 150 is exhausted by the vacuum exhausting system, gas supplied from the nozzle 112 exists. Therefore, an aperture 152 to penetrate the EUV light EL and prevent an inflow of gas existed in the light source chamber 150 to the illumination system chamber 250 is provided a border of the light source chamber 150 and the illumination system chamber 250. The aperture 152 forms a differential pumping between the light source chamber 150 and the illumination system chamber 250. An amount of gas that flows into the illumination system chamber 250 from the light source chamber 150 can be reduced, so that a size of the aperture 152 is small. Therefore, a position of the aperture 152 preferably corresponds to the position of the condensing point CP, and the size of the aperture 152 preferably corresponds to a size of the condensing point CP.

The detector 170 detects properties of the EUV light EL located between the condensing point CP and the illumination optical system 200, and is, in the instant embodiment, a light intensity distribution measuring apparatus 170A that measures the light intensity distribution of the EUV light EL near the condensing point CP. The light intensity distribution measuring apparatus 170A is movable in the Y-axis direction by a Y-axis stage (not shown) and Y-stage driving source (not shown). Therefore, the light intensity distribution measuring apparatus 170A is provided a position that does not interrupt an optical path of the EUV light EL as shown in FIG. 2, while the exposure apparatus 1 executes the exposure. Then, the light intensity distribution measuring apparatus 170A is provided on the optical path of the EUV light EL as shown in FIG. 3 when measures the light intensity of the EUV light EL.

Figure 4:
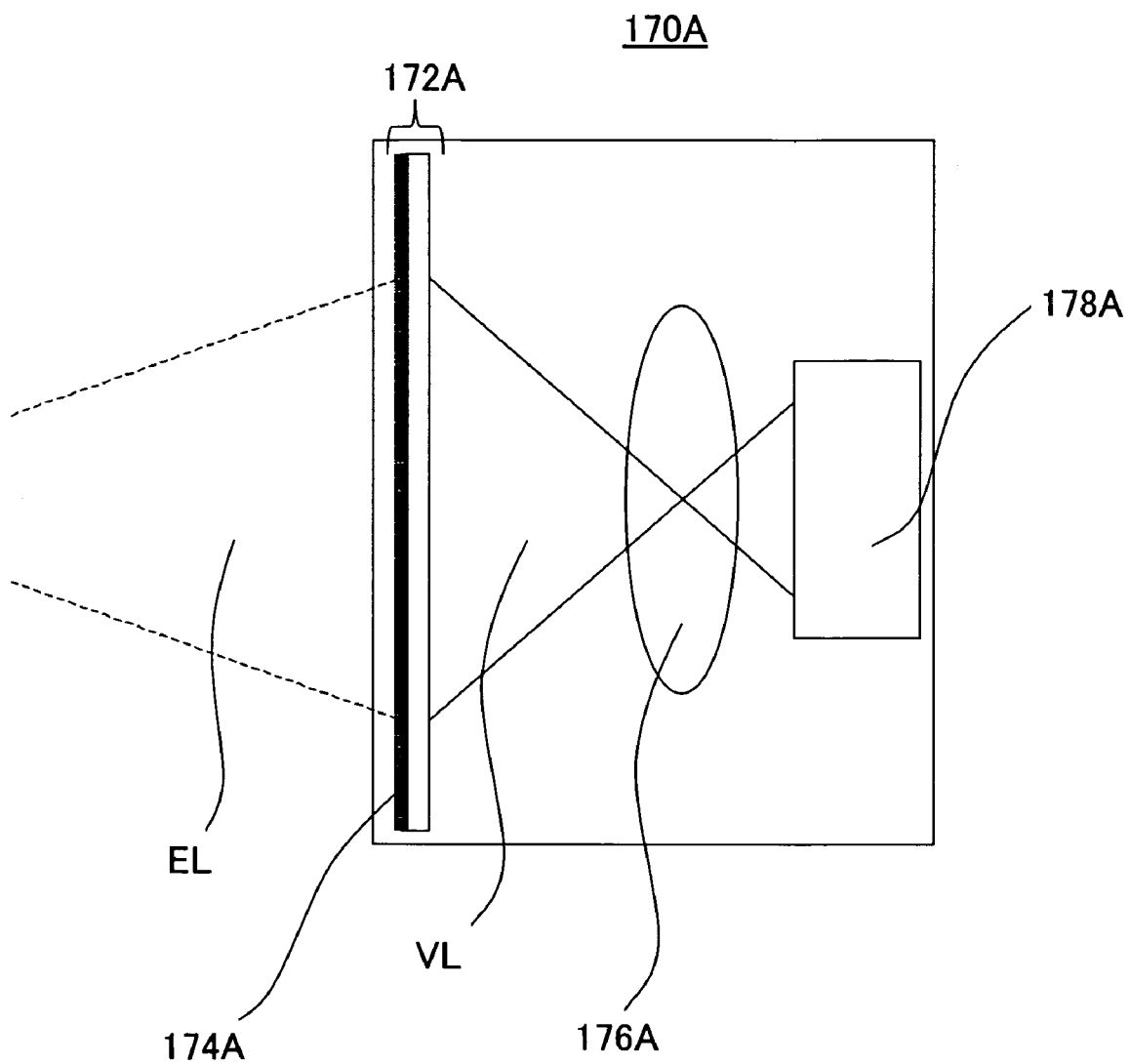
FIG. 4 is a schematic sectional view of a light intensity measuring apparatus shown in FIGS. 2 and 3.

FIG. 4 shows the light intensity distribution measuring apparatus 170A. The light intensity distribution measuring apparatus 170A includes, as shown in FIG. 4, a fluorescence board 172A, an imaging optical system 176A, and a CCD 178A.

The fluorescence board 172A includes a filter 174A consisted of a material that penetrates the EUV light EL and absorbs ultraviolet light with a wavelength of 20 nm or more (for example, zirconium (Zr)), and a material that absorbs infrared light (for example, silicon (Si)) at an incident side of the EUV light EL. The fluorescence board 172A absorbs ultraviolet light and infrared light traveling illumination optical system 200 similar to the EUV light EL by the filter 174A, and converts the EUV light EL from the condensing point CP into visible light VL. The visible light VL has a light intensity proportional to the EUV light EL used for the exposure.

The imaging optical system 176A is an optical system that forms an imaging relationship between the fluorescence board 172A and the CCD 178A as a two-dimensional visible light detector. Thereby, an output (detected result) from the CCD 178A shows the light intensity distribution of the EUV light EL on the fluorescence board 172A, and the light intensity distribution measuring apparatus 170A can measure the light intensity distribution of the EUV light EL. However, the light intensity distribution measuring apparatus 170A is not limited to this structure, may detect the light intensity distribution of the EUV light EL in two-dimensional. Moreover, if the light intensity distribution of the EUV light EL is always an axial symmetry, the light intensity distribution measuring apparatus 170A may detects the light intensity distribution of the EUV light EL in one-dimensional.

Figure 5:
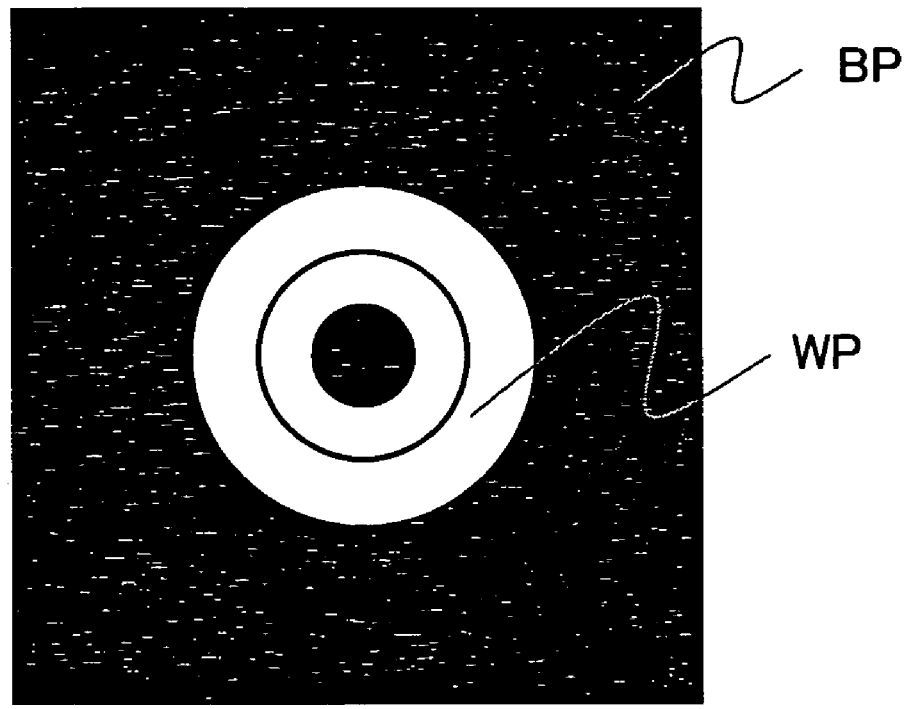
FIG. 5 is a view of a light intensity of EUV light near a condensing point in FIG. 3.
Figure 5:
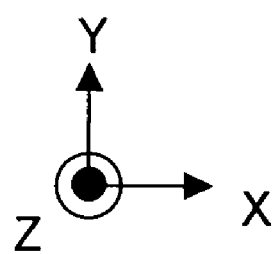

The position of the plasma PL and the position of the condensing point CP decided corresponding to the position of the plasma PL shown in FIG. 3 are positions in the initial state of the electrode 114 included light source apparatus 100, debris filter 120 and condenser mirror 130. FIG. 5 shows the light intensity distribution of the EUV light EL measured using the light intensity distribution measuring apparatus 170A. The light intensity distribution of the EUV light EL shown in FIG. 5 is the same as an image of the EUV light EL in the fluorescence board 172A, the EUV light EL is irradiated to a white part WP, and the EUV light EL is not irradiated to a black part BP.

Figure 6:
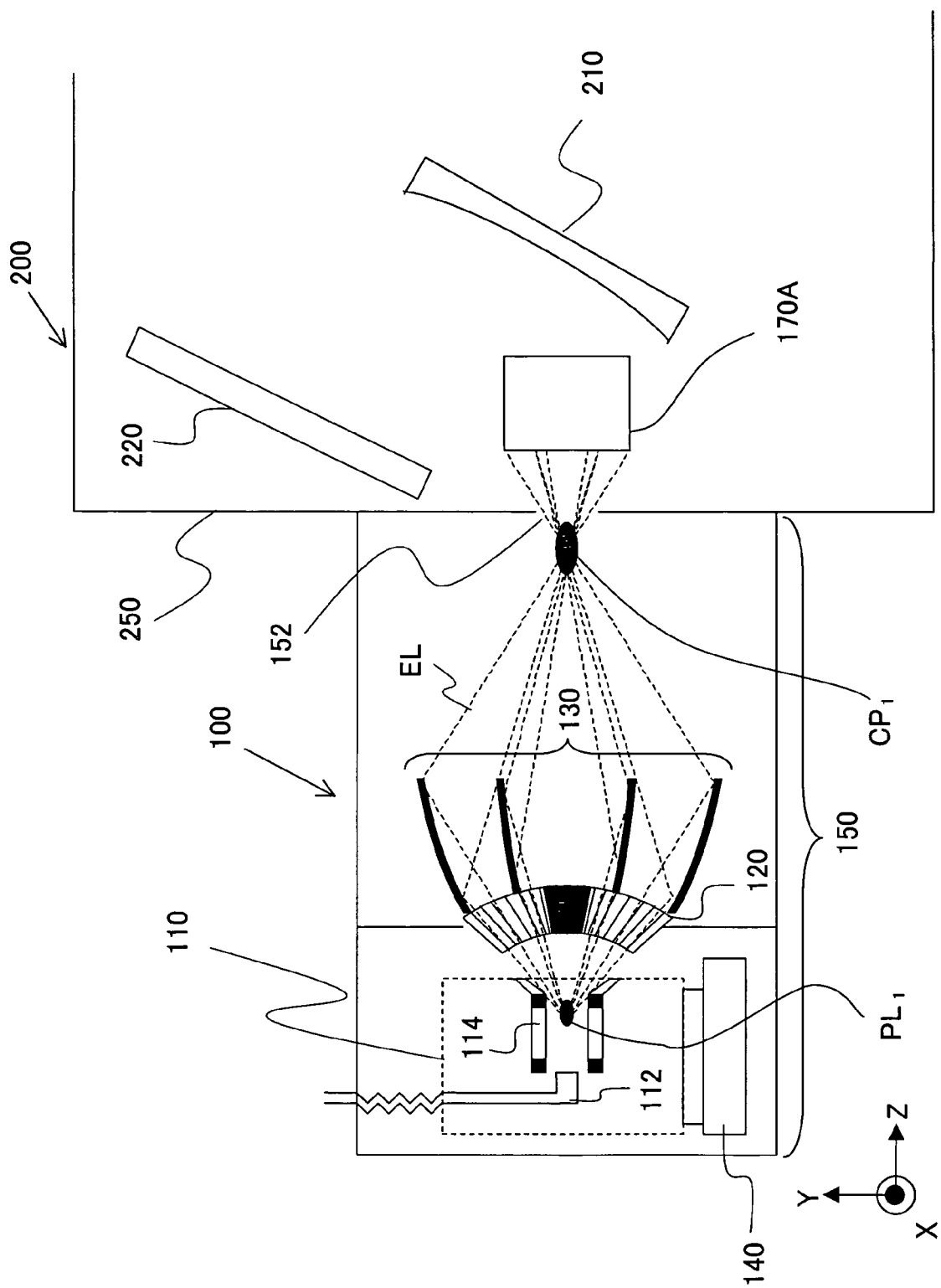
FIG. 6 is a view of one example when an electrode of the light source apparatus shown in FIG. 3 deteriorates.
Figure 7:
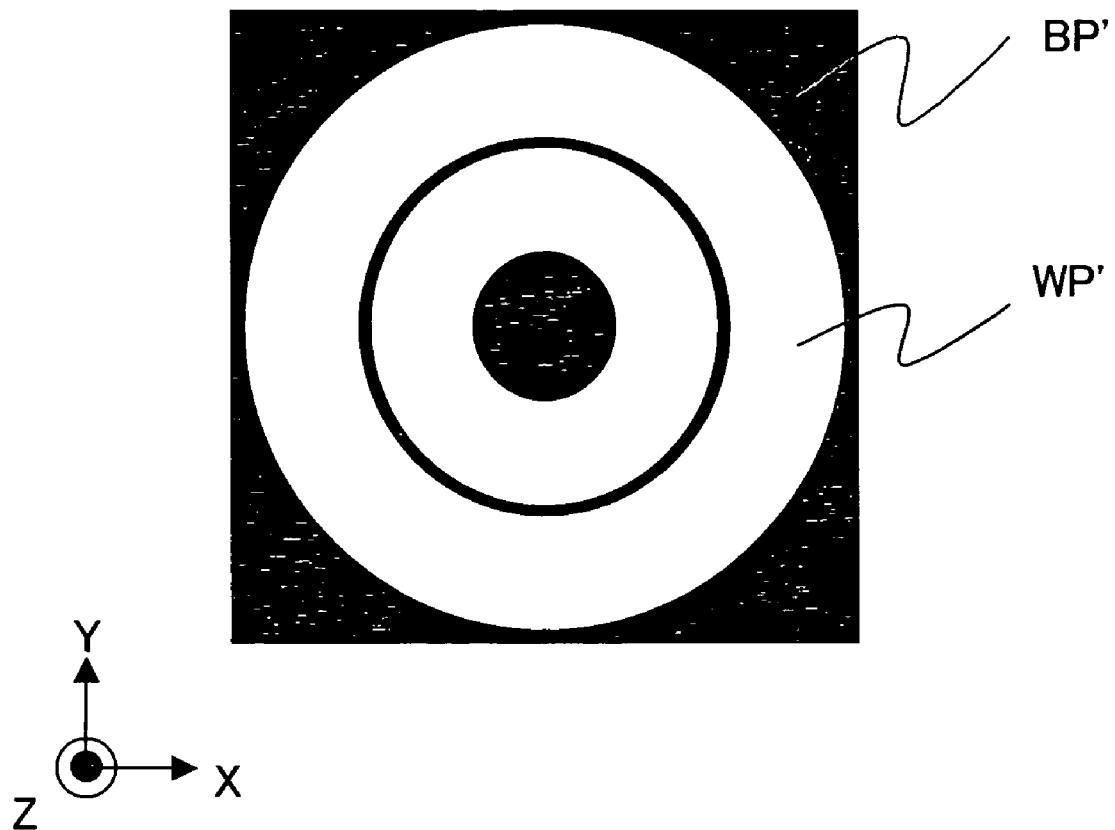
FIG. 7 is a view of a light intensity distribution of EUV light near a condensing point in FIG. 6.

By operating (using) the light source apparatus 100 for a long time, the electrode 114 deteriorates in the melt etc. by the heat of plasma PL, and FIG. 6 shows the plasma $PL_1$ generated by a different position from the initial state shown in FIG. 3. The plasma $PL_1$ exists in a minus direction of the Z-axis from the position of the plasma PL in the initial state. A condensing point CP1 also corresponds to the plasma $PL_1$, and exists in the minus direction of the Z-axis from the position of the condensing point CP in the initial state. FIG. 7 shows the light intensity distribution of the EUV light EL measured using the light intensity distribution measuring apparatus 170A in the state shown in FIG. 6. The light intensity distribution of the EUV light EL shown in FIG. 7 is the same as the image of the EUV light EL in the fluorescence board 172A, the EUV light EL is irradiated to a white part WP', and the EUV light EL is not irradiated to a black part BP'.

Referring to FIG. 7, an outer diameter of the image of the EUV light EL in the fluorescence board 172A becomes large as compared with the image of the EUV light EL in the initial state shown in FIG. 5, and the light intensity is different from the initial state. Therefore, the mask 300 can not be illuminated uniformly in this state, and the performance of the exposure apparatus 1 such as the resolution deteriorates.

Figure 8:
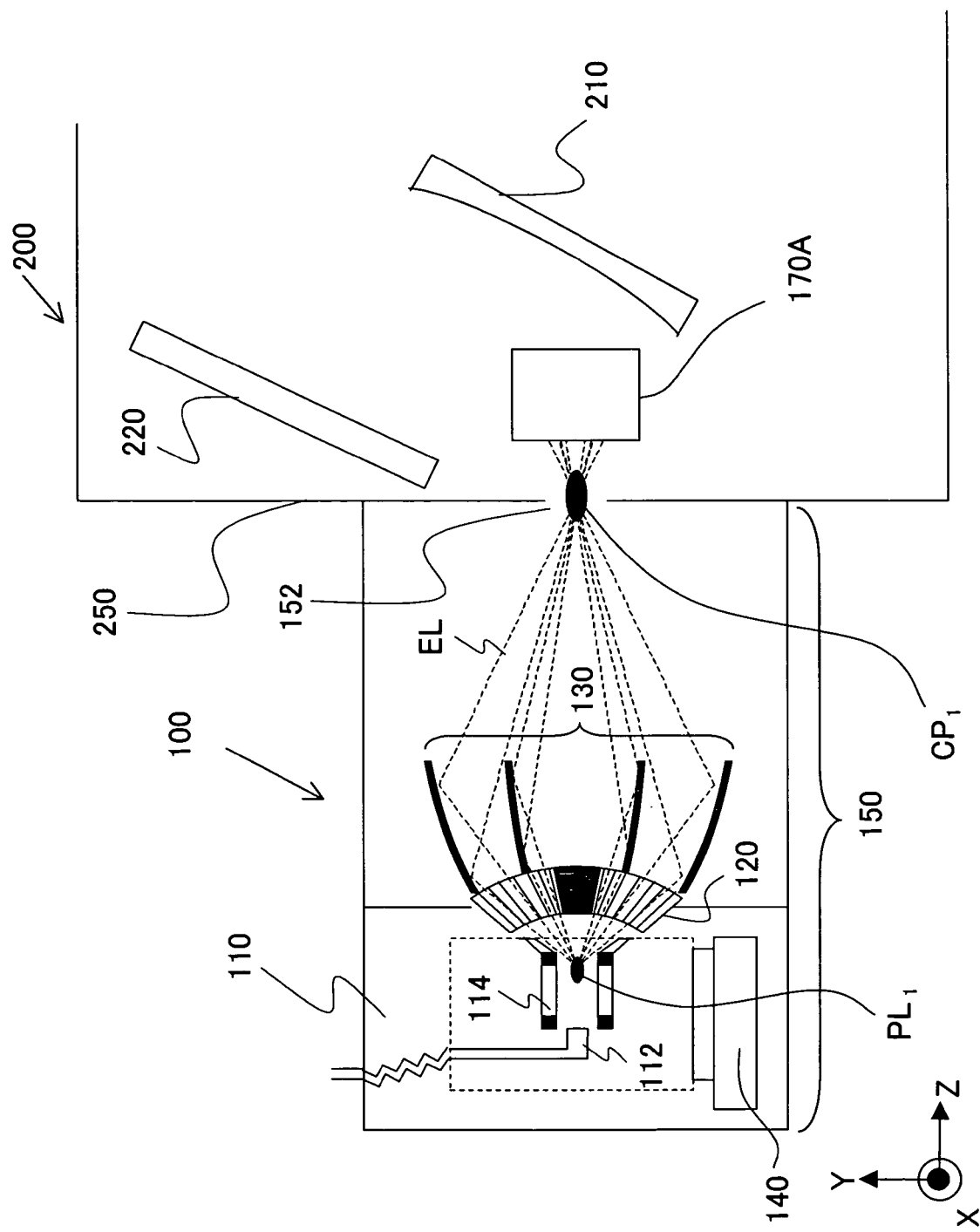
FIG. 8 is a schematic sectional view of a state that corrected a position of plasma to an initial position.
Figure 9:
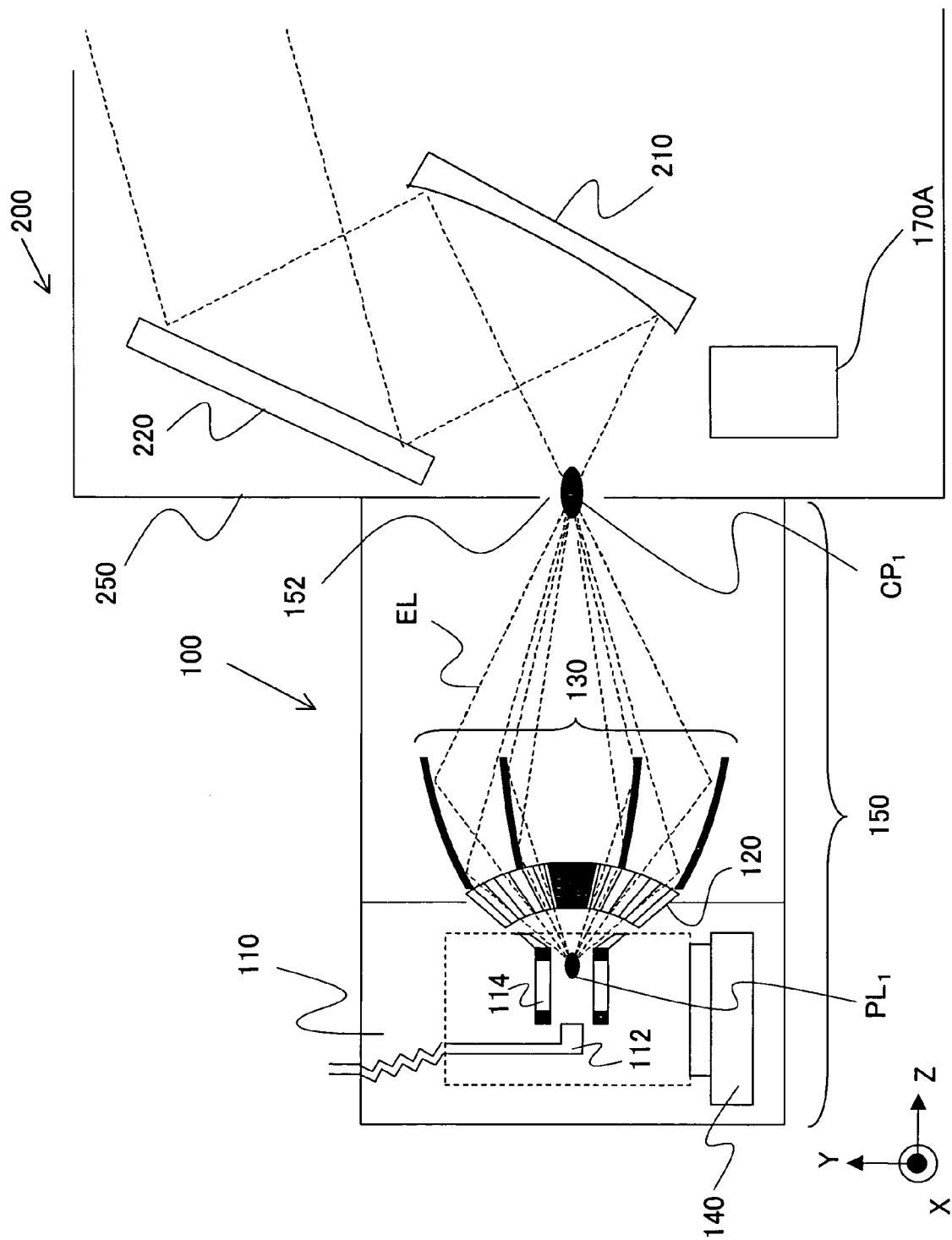
FIG. 9 is a schematic sectional view of a light source apparatus that evacuated the light intensity distribution measuring apparatus to an outside of a light path of EUV light in FIG. 8.

In such a case, as shown in FIG. 8, the state 140 is driven, and the position of the plasma $PL_1$ corresponds to the position of the plasma PL as the initial position (shown in FIG. 3) by moving the generating part 110 in a plus direction of the Z-axis. As a result, the position of the condensing point $CP_1$ corresponds to the position of the condensing point CP as the initial position (shown in FIG. 3), and the light intensity distribution of the EUV light EL corresponds to the initial state. Therefore, the light intensity distribution of the EUV light EL measured using the light intensity distribution measuring apparatus 170A is shown by FIG. 5 as same as initial state. Thereby, the exposure apparatus 1 can expose by the same performance as the initial state shown in FIG. 2 by evacuating the light intensity distribution measuring apparatus 170A to the outside of the optical path of the EUV light EL as shown in FIG. 9. Here, FIG. 8 is a schematic sectional view of the light source apparatus 100 that corrects the position of the plasma PL$_1$ to the initial position. FIG. 9 is a schematic sectional view of the light source apparatus 100 that evacuated the light intensity distribution measuring apparatus 170A to the outside of the optical path of the EUV light EL.

Preferably, the measuring the light intensity of the EUV light EL using the light intensity distribution measuring apparatus 170A is executed to a timing that does not need the EUV light EL, such as an exchanging time of the wafer for instance, among during operation (exposure) of the exposure apparatus 1. Thereby, the measurement of the light intensity of the EUV light EL becomes possible without dropping a throughput. A time interval of the measurement of the light distribution of the EUV light EL is determined according to a change speed of the position of the plasma PL. For example, when a change per time is little, the time interval is determined for long. On the other hands, when the change par time is large, the time interval is determined for short.

Figure 10:
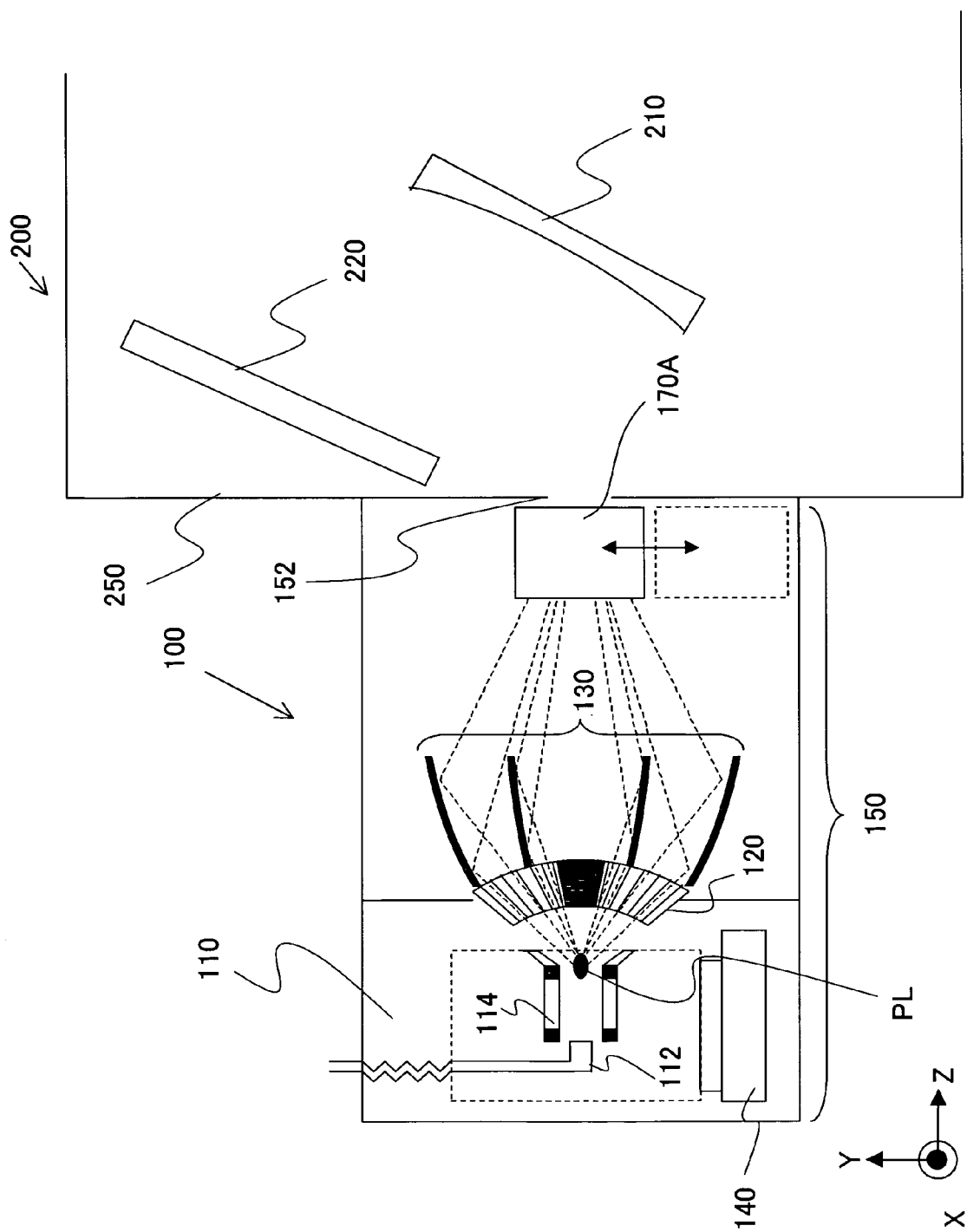
FIG. 10 is a schematic sectional view of a light source apparatus that provides a light intensity distribution measuring apparatus between a condenser mirror and a position of a condensing point.

The light intensity distribution measuring apparatus 170A measures, in the instant embodiment, the light intensity of the EUV light EL of the position between the condensing point CP and the optical-system 200 (in detail, the illumination system mirror 210 at the most light source 100 side of the illumination optical system 200). In other words, the light intensity distribution measuring apparatus 170A measures is provided between the condensing point CP and the optical system 200. However, it does not limited to this. For example, the light intensity distribution measuring apparatus 170A may be provided near the condensing point CP or between the condenser mirror 130 and the position of the condensing point CP as shown in FIG. 10. However, because an influence of noise from the plasma PL may become large, the light intensity distribution measuring apparatus 170A is provided between the condensing point CP and the illumination optical system 200 preferably. If properties of the EUV light EL are detected in a latter part of the illumination optical system 200, a deterioration of the illumination optical system's components is added to a deterioration of the light source apparatus's components, and the change factor of properties of the EUV light EL is inseparable. Here, FIG. 10 is a schematic sectional view of the light source apparatus 100 that provides the light intensity distribution measuring apparatus 170A between the condenser mirror 130 and the position of the condensing point CP.

In the instant embodiment, the case that the position of the plasma PL changes in the Z-axis direction by operating (using) the light source apparatus 100 for a long time was explained. However, for example, when the position of the plasma PL changes in the Y-axis direction, the position of the plasma PL may be corrected by moving the generating part 110 in the Y-axis direction.

The light source apparatus 100 detects the light intensity distribution of the EUV light EL within the divergence angle divergent from the condensing point CP by the light intensity distribution measuring apparatus 170A, and corrects the position of the plasma PL based on the detected result. Thereby, the light source apparatus 10 can stably and uniformly illuminate the mask 300. Moreover, the light source apparatus 100 can control the optical integrator for uniformly illuminating included in the illumination optical system 200 to the minimum by uniformly illuminating the mask 300. Thereby, a number of the reflective surface that is a factor that reduces the light intensity of the EUV light EL can be reduced, an efficient illuminating is possible, and the exposure apparatus with high throughput can be achieved. Moreover, the light source apparatus 100 can maintain the initial performance as the exposure apparatus 1, even if the deterioration of the light source apparatus's components occurs. Therefore, a life until exchanging the light source apparatus 100 becomes long, and a running cost can be reduced.

Figure 11:
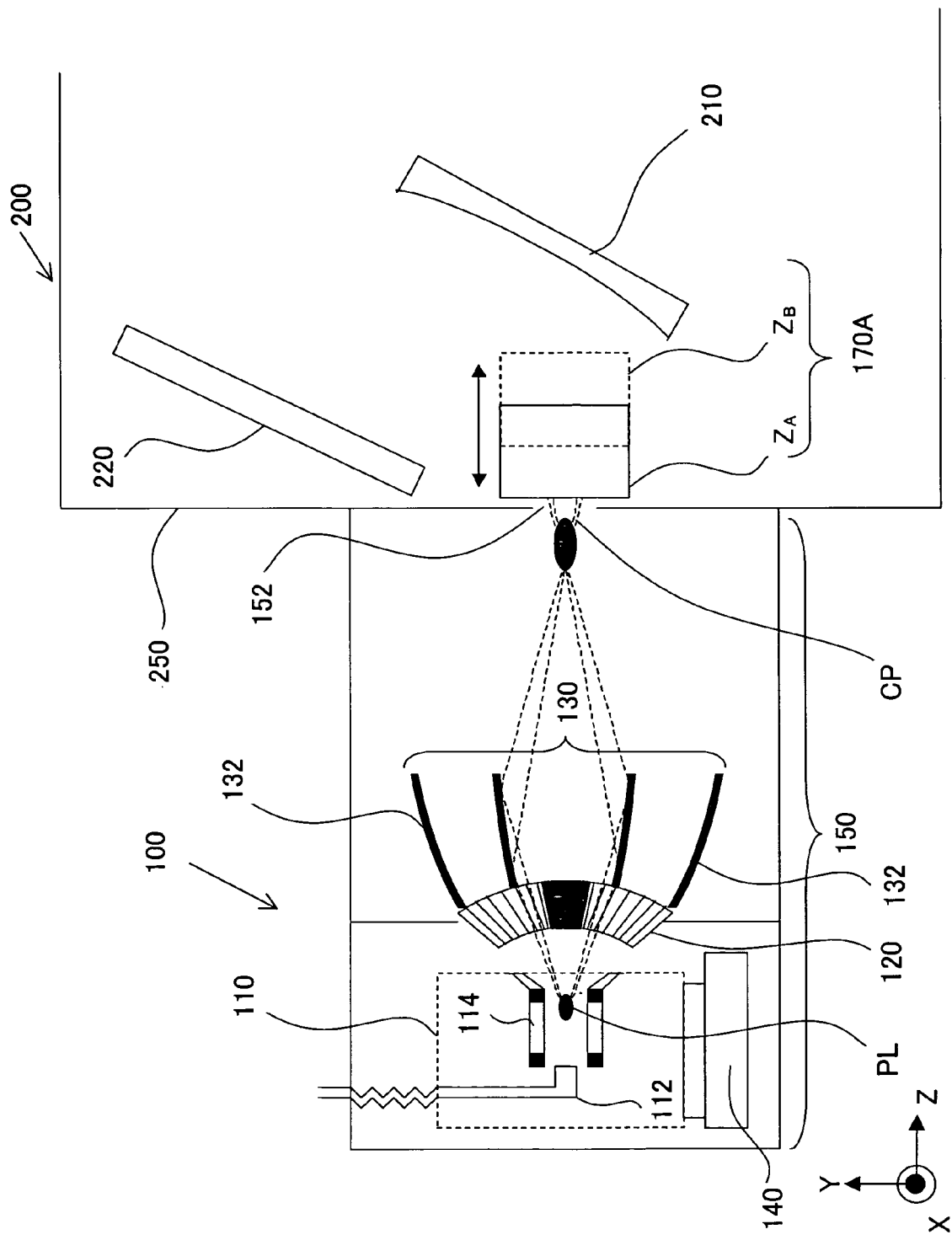
FIG. 11 is a schematic sectional view of a light source apparatus of the exposure apparatus shown in FIG. 1.

Moreover, the light intensity distribution measuring apparatus 170A is moveable in the Z-axis direction as shown in FIG. 11, and may measure the light intensity of the EUV light EL of at least two positions (in the instant embodiment, a position $Z_A$ and a position $Z_B$) on the Z-axis. Here, FIG. 11 is a schematic sectional view of the light source apparatus 100 of the exposure apparatus 1.

In the structure shown in FIG. 3, only an outside mirror 132 of the condenser mirror 130 deteriorates by long time operation of the light source apparatus 100, when the outside mirror 132 does not reflect the EUV light EL, the divergence angle from the condensing point CP changes. Therefore, the position of the condensing point CP can not be grasped. On the other hands, in the structure shown in FIG. 11, even if the divergence angle from the condensing point CP changes by long time operation of the light source apparatus 100, the light intensity distribution measuring apparatus 170A can measure the light intensity of the EUV light EL in at least two positions, the position $Z_A$ and the position $Z_B$. Therefore, the position of the condensing point CP can be grasped. Thereby, the light source apparatus 100 can corrects the position of the plasma PL to a suitable position by driving the stage 140.

In addition, it is also considered that the image of the plasma PL is obtained by the pinhole camera etc. and the position of the plasma PL is corrected by driving the stage 140 (in other words, moving the generating part 110) based on the obtained image position. However, it is difficult to enlarge an angle between an imaging optical axis of the pinhole camera and the Z-axis by restrictions of components arranged around the plasma PL, and it is difficult to detect the position of the plasma PL on the Z-axis with high accuracy.

Figure 12:
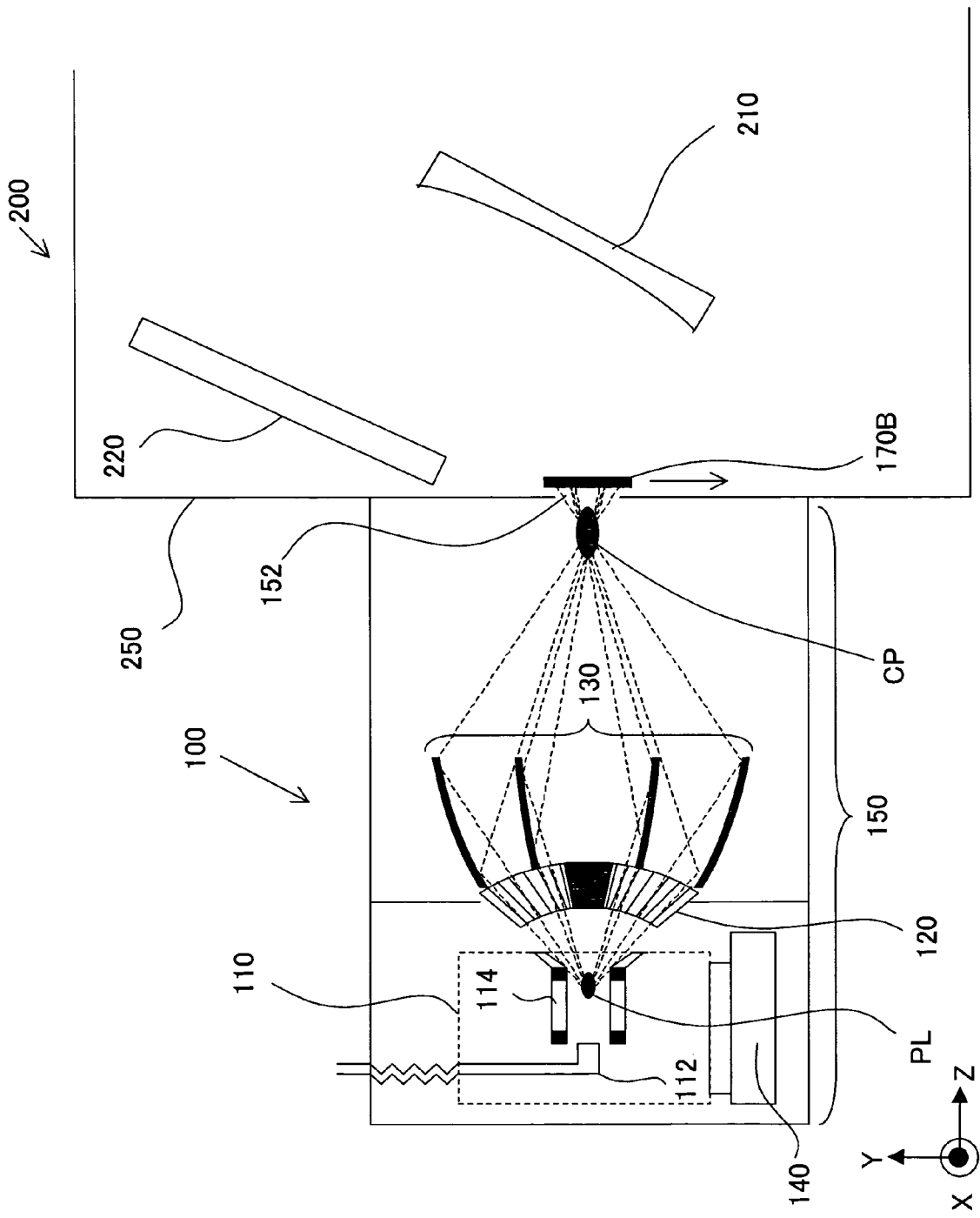
FIG. 12 is a schematic sectional view of a light source apparatus of the exposure apparatus shown in FIG. 1.

The detector 170 of the light source apparatus 100 is not limited to the light intensity distribution measuring apparatus 170A, may use a light intensity detector 170B as shown in FIG. 12. FIG. 12 is a schematic view of the light source apparatus 100 that uses the light intensity detector 170B as the detector 170.

The light intensity detector 170B is located on and removed from on the optical path of the EUV light EL just behind the aperture 152, and detects the light intensity of the EUV light EL. The light intensity detector 170B is a photodiode or CCD having a filter consisted of a material that penetrates the EUV light EL and absorbs ultraviolet light with a wavelength of 20 nm or more (for example, zirconium (Zr)), and a material that absorbs infrared light (for example, silicon (Si)) at the incident side of the EUV light EL. The light intensity detector 170B outputs a signal proportional to the light intensity of the EUV light EL.

When the deterioration of the light source apparatus's components occurs by the long time operation of the exposure apparatus 1 and the position of the condensing point CP changes, the position of the condensing point CP separates from the aperture 152. Therefore, the EUV light EL interrupted by the aperture 263 occurs and the light intensity of the EUV light EL passed through the aperture 152 reduces. This reduced light intensity is detected by the light intensity detector 170B, then and the position of the plasma PL can be adjusted by driving the stage 140 so that the light intensity of the EUV light EL becomes the same as the initial state.

Figure 13:
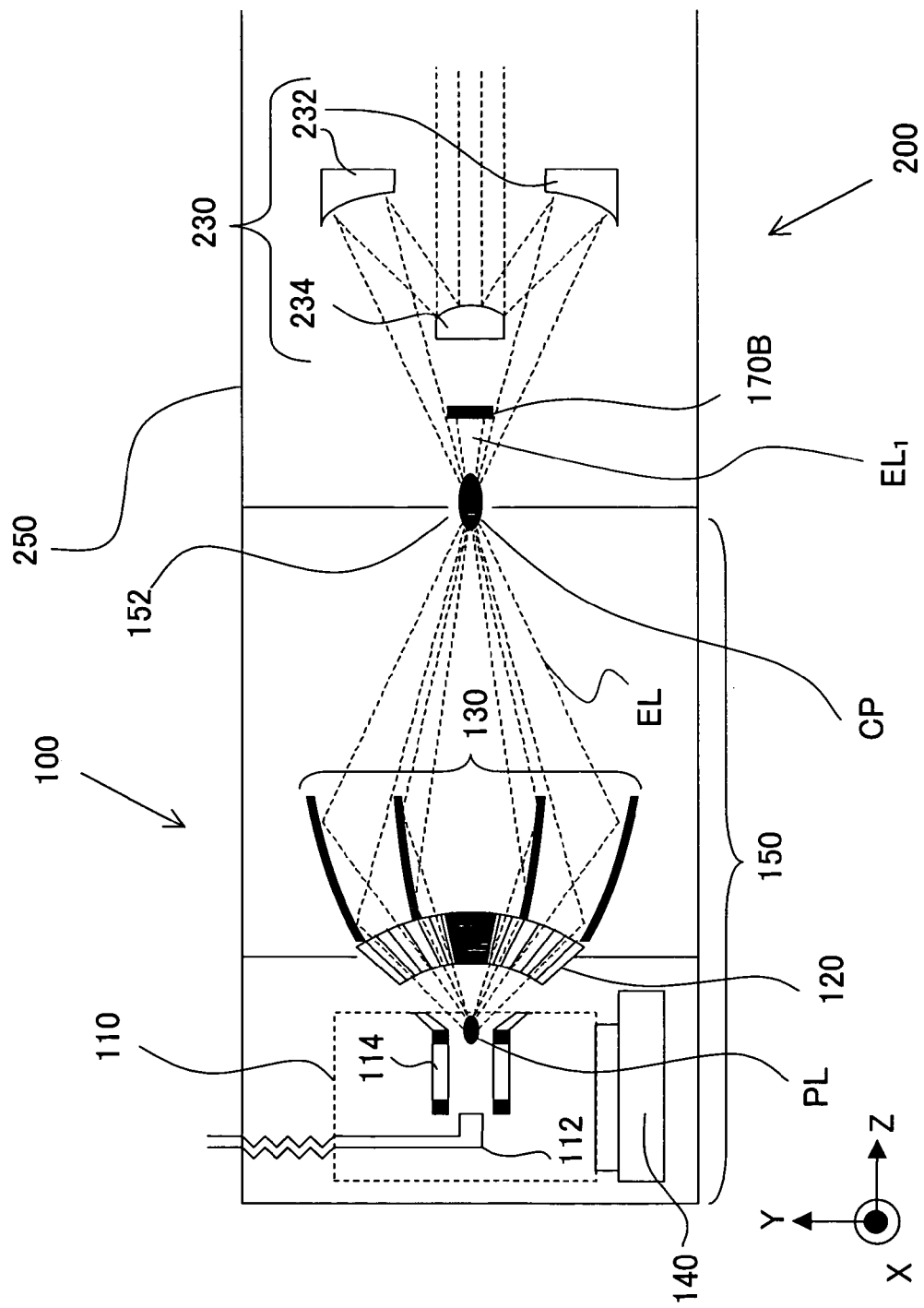
FIG. 13 is a schematic sectional view of a light source apparatus of the exposure apparatus shown in FIG. 1.

Moreover, in the subsequent illumination optical system 100, it is considered that an optical element that is first entered by the EUV light EL from the light source apparatus 100 is, as shown in FIG. 13, a Schwarzschild mirror 230 including a concave mirror 232 and a convex mirror 234. In this case, the light intensity detector 170B can be provided at a position that can detect only the light intensity of the EUV light $EL_1$ that is not used for illuminating of the mask 300 (in other words, an angle with the Z-axis is small) among the EUV light EL divergent from the condensing point CP. Thereby, the light intensity of the EUV light EL1 is always detectable during the operation of the light source apparatus 100 (generating the plasma PL). Here, FIG. 13 is a schematic sectional view of the light source apparatus 100 that uses the light intensity detector 170B as the detector 170.

For example, when the position of the condensing point CP changes in a plus direction of the Z-axis by changing the position of the plasma PL, the light intensity detected by the light intensity detector 170B becomes large because the EUV light $EL_1$ that is incident upon the light intensity detector 170B increases. On the other hands, when the position of the condensing point CP changes in a minus direction of the Z-axis, the light intensity detected by the light intensity detector 170B becomes small because the EUV light $EL_1$ that is incident upon the light intensity detector 170B decreases. By using this, the position of the plasma PL can be adjusted so that the position of the condensing point CP exists the suitable position based on the light intensity of the EUV light $EL_1$ detected by the light intensity detector 170B In the instant embodiment, since the position of the condensing point CP is detected by the EUV light $EL_1$ that is not used for the exposure, the position of the condensing point CP is always detectable during the exposure. Therefore, not only the long time changes caused by deteriorate of the light source apparatus's components etc. but also the short time changes caused by a vibration and a temperature change etc. can be grasped. Thereby, the light source apparatus 100 can control so that the light intensity of the EUV light $EL_1$ detected by the light intensity detector 170B becomes a predetermined value. Moreover, the light source apparatus 100 can control so that the light intensity of the EUV light $EL_1$ detected by the light intensity detector 170B becomes within a predetermined range in a range that does not influence to non-uniformly illumination on the mask 300.

Figure 14:
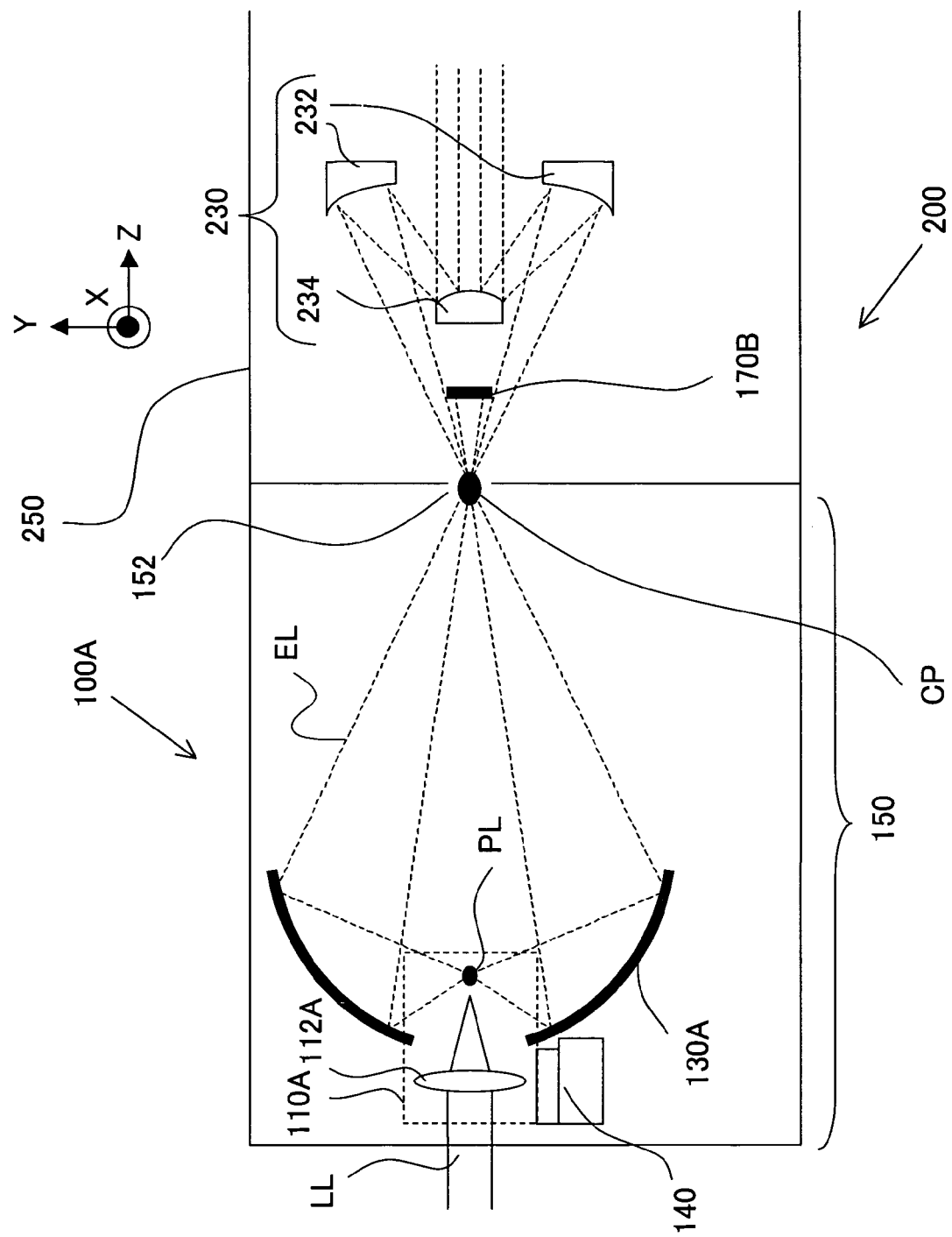
FIG. 14 is a schematic sectional view of a light source apparatus constituted the light source apparatus shown in FIG. 13 as a laser plasma system.

The light source apparatus 100 is not limited to the discharge plasma light source, and can consist of the laser plasma light source similarly. FIG. 14 is a schematic sectional view of a light source apparatus 100A constituted the light source apparatus 100 shown in FIG. 13 as a laser plasma system.

The light source apparatus 100A is the laser plasma light source, and includes, as shown in FIG. 14, a generating part 110A and a condenser mirror 130A.

The generating part 110A includes a nozzle (not shown) for supplying a liquid as the target material and a laser condensing optical system 112A for condensing the laser beam LL onto the target material, and is fixed to the stage 140. The generating part 110A generates the plasma PL by irradiating the condensed laser beam LL onto the target material. The plasma PL generates the EUV light EL.

The EUV light EL from the plasma PL is reflected by the condenser mirror 130A with a spheroid form having a multilayer film that alternately forms or layers molybdenum (Mo) and silicon (Si), and condenses at the condensing point CP.

If the position of the plasma PL changes on the Z-axis, the position of the condensing point CP changes. However, as above-mentioned, the position of the plasma PL can be adjusted so that the position of the condensing point CP exists the suitable position based on the light intensity of the EUV light $EL_1$ detected by the light intensity detector 170B.

The detector 170 detects at least one of the position of the condensing point CP in between the condenser mirror 130 or 130A that condenses the EUV light EL ant the illumination optical system 200, the light intensity of the EUV light EL in the condensing point CP, and the light intensity distribution within the divergence angle divergent from the condensing point CP. However, a physical quantity for detecting properties of the EUV light EL is not limited to these. Similarly, although the position of the plasma PL is corrected based on properties of the EUV light EL detected by the detector 170, the correcting object is not limited to the position of the plasma PL.

For example, A spectrum of the EUV light EL that is incident upon the illumination optical system 200, and a plasma electron temperature of the plasma PL may be adjusted based on the detected result. In other words, it grasps whether the detected spectrum of the EUV light EL is the suitable, and the plasma electron temperature of the plasma PL may be adjusted.

Figure 15:
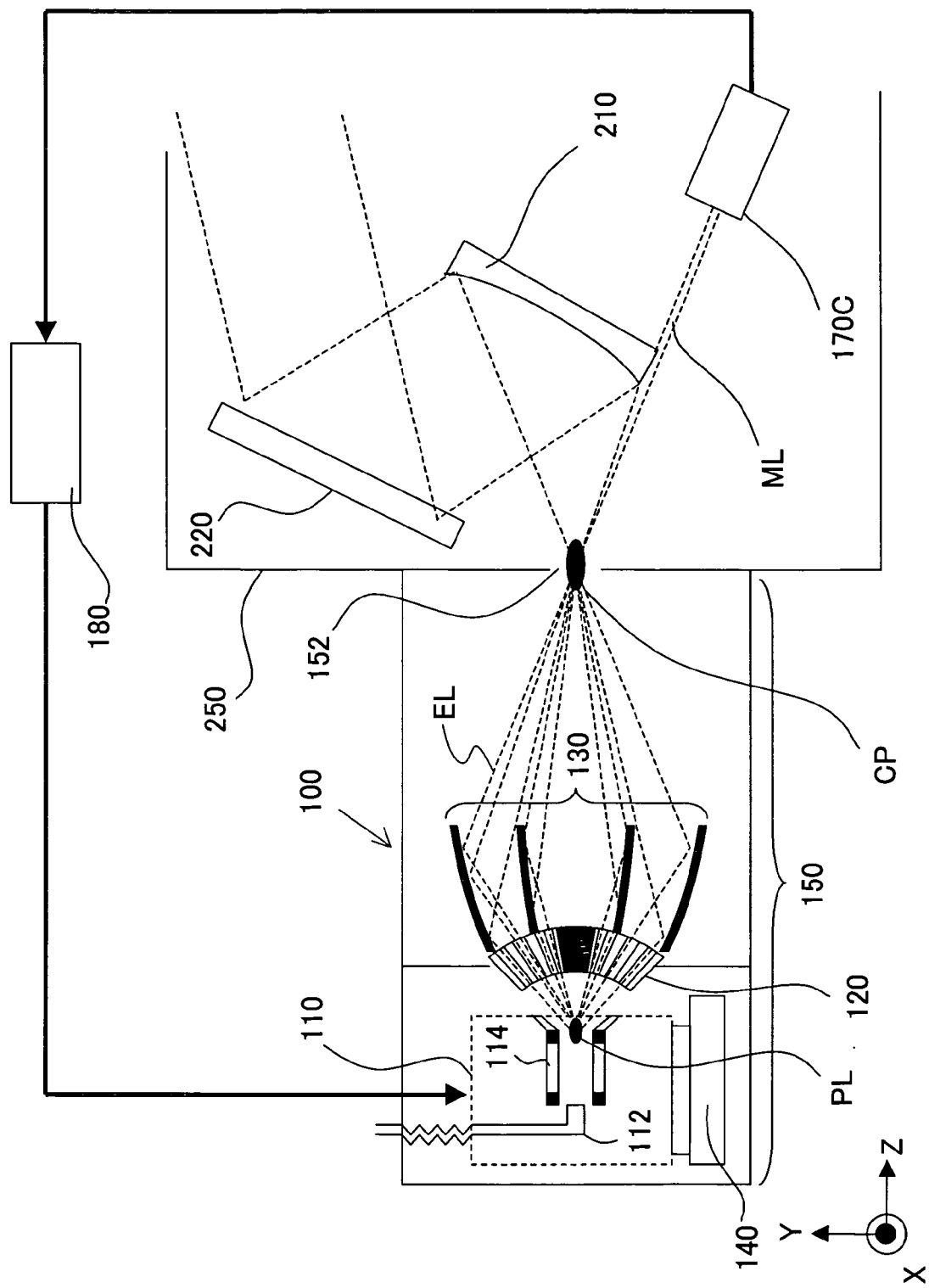
FIG. 15 is a schematic sectional view of a light source apparatus of the exposure apparatus shown in FIG. 1.

FIG. 15 shows the light source apparatus 100 that includes a spectrum measuring apparatus 170C as the detector 170, and adjusts the plasma electron temperature of the plasma PL based on the spectrum of the EUV light EL detected by the spectrum measuring apparatus 170C. Referring to FIG. 15, most light that is incident upon the illumination system chamber 250 is reflected by the illumination system mirror 210. However, a part of the EUV light EL is not incident upon the illumination system mirror 210, and is incident upon the spectrum measuring apparatus 170C as an object light ML to measure the spectrum.

The object light ML is a light that does not through the optical element of the illumination optical system 200, and is almost the same as a spectrum of the condensing point CP in the position between the condenser mirror 130 for condensing the EUV light EL from the plasma PL and the illumination optical system 200.

Figure 16:
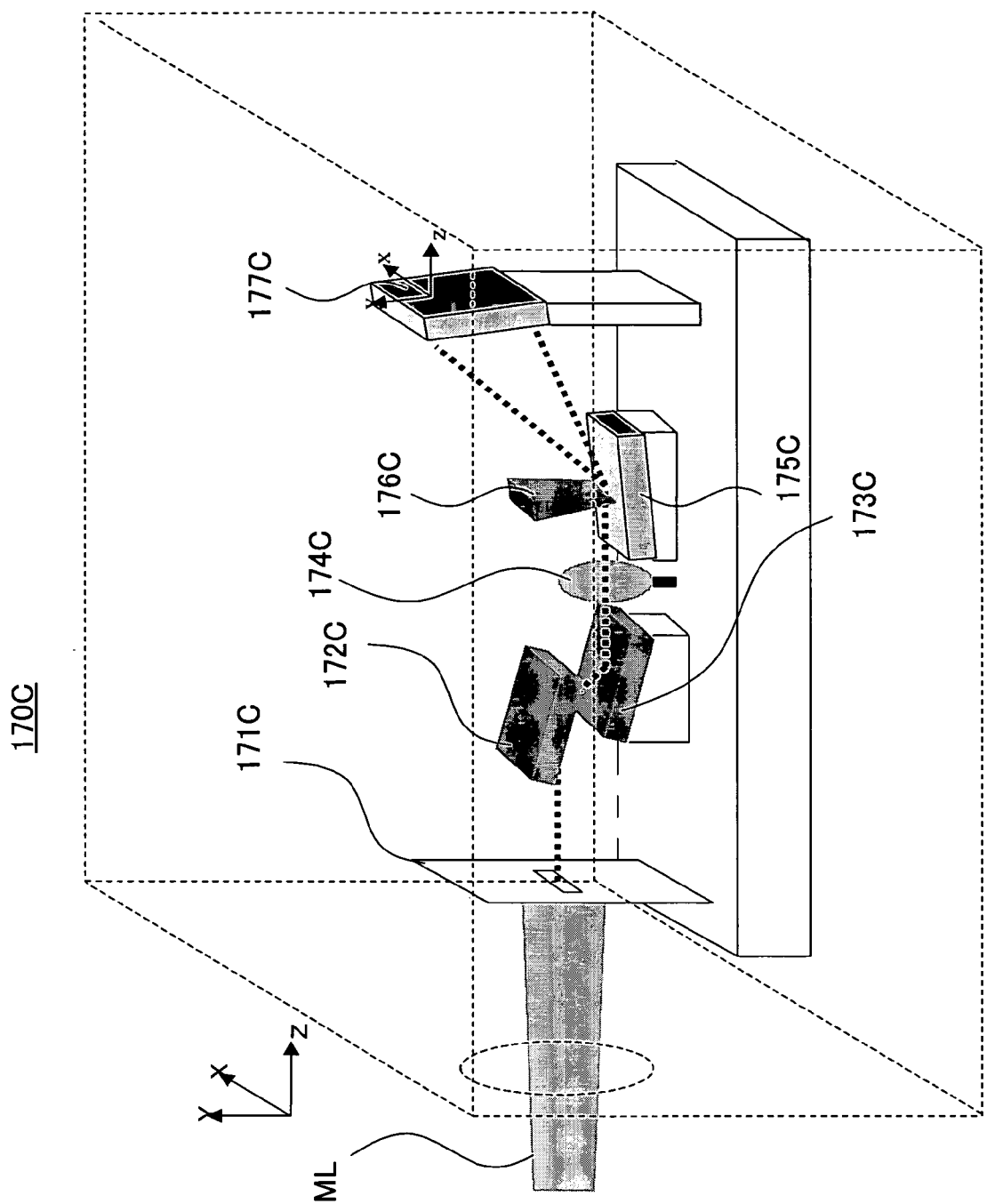
FIG. 16 is a schematic perspective view of a spectrum measuring apparatus shown in FIG. 15.

FIG. 16 is a schematic perspective view of the spectrum measuring apparatus 170C. The spectrum measuring apparatus 170C includes an aperture 171C, high-order light cut mirrors 172C and 173C, a visible light cut filter 174C, a plane surface imaging type diffractive optical element 175C, an edge aperture 176C, and a CCD 177C. Hereafter, as shown in FIG. 16, a coordinate axis that sets Z-axis as an optical axis of the object light ML, and a coordinate axis on the CCD 177C that sets x-axis, y-axis, and z-axis as a lateral, a vertical, and a depth of the CCD 177C.

Referring to FIG. 16, the object light 171C is shaped by the aperture 171C. The shaped object light ML is reflected by the high-order light cut mirrors 172C and 173C that covered diamond-like carbon on a surface for instance. Thereby, a wavelength component according to the high-order light with a measurement wavelength region is removed.

Next, the visible light and infrared light in the object light ML is removed by the visible light cut filter 174C that is formed by a zirconium (Zr) thin film. Moreover, the object light ML is limited to a predetermined direction on Y-Z surface by the edge aperture 176C that is provided in an almost perpendicular direction to the plane surface imaging type diffractive optical element 175C and limits Y-axis angle.

Moreover, the object light ML is incident upon the plane surface imaging type diffractive optical element 175C, and wavelength-disperses in the y-axis direction. The short wavelength is incident upon minus side of the y-axis of the CCD 177C as the detector, and the long wavelength is incident upon plus side of the y-axis of the CCD 177C as the detector. Thereby, an output of the CCD 177C becomes a signal proportional to the light intensity of each wavelength. The signal intensity of each wavelength is divided by reflectance of the high-order light cut mirrors 172C and 173C, a transmittance of the visible light cut filter 174C, and a diffractive efficiency of the plane surface imaging type diffractive optical element 175C for each wavelength. Therefore, an intensity ratio for each wavelength, in other words, the spectrum can be detected. However, the spectrum measuring apparatus 170C is not limited to this structure, and may be other structure according to the light intensity of the object light ML (EUV light EL) etc. The spectrum of the object light ML (EUV light EL) detected by the spectrum measuring apparatus 170C is sent to an adjusting part 180 that adjusts the plasma electron temperature of the plasma PL.

Figure 17:
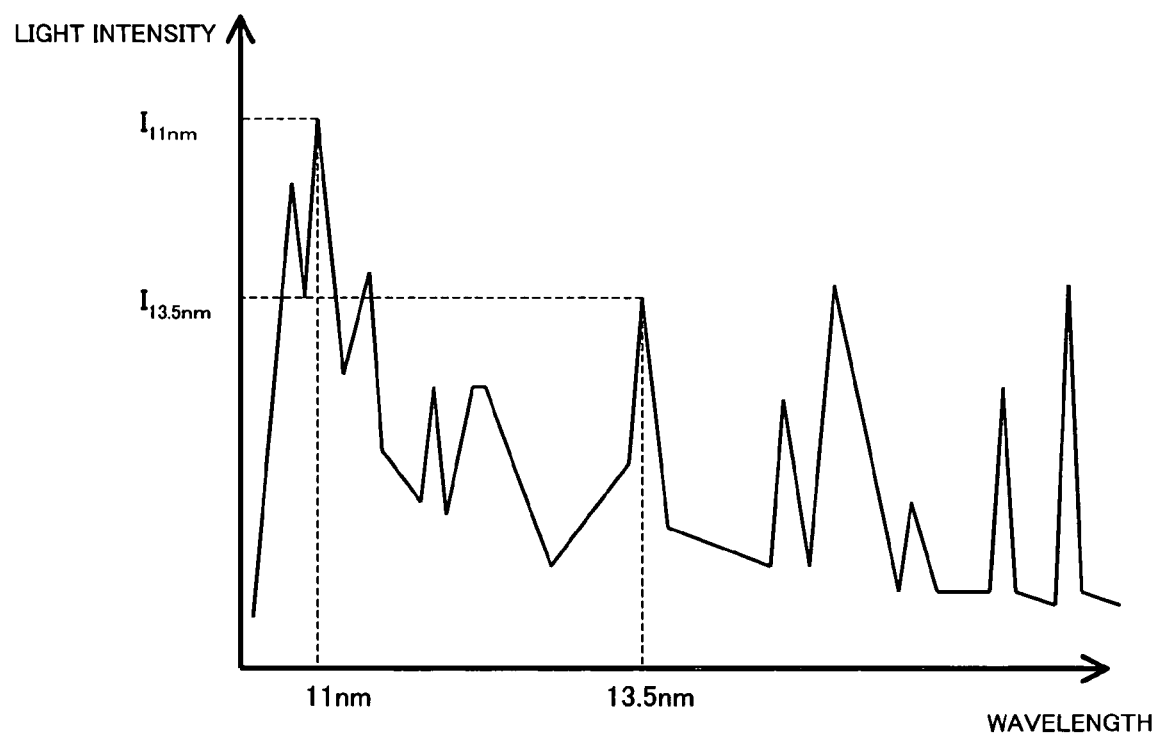
FIG. 17 is a graph of one example of a spectrum detected by the spectrum measuring apparatus shown in FIG. 16.

If gas that generates the plasma PL is xenon (Xe), the spectrum of the object light ML detected by the spectrum measuring apparatus 170C is shown in FIG. 17, when the light source apparatus's components does not deteriorate. The EUV exposure apparatus uses the EUV light with a bandwidth of approximately 2% near 13.5 nm, in other words, the light with a wavelength of approximately 13.365 nm to 13.635 nm (referred to as a "13.5 nm 2% bandwidth light" hereinafter) A peak of 13.5 nm corresponding to it has an intensity of $I_{13.5\ nm}$. The EUV light EL from the plasma PL includes a lot of light that has an energy transition other that an energy transition corresponding to 13.5 nm, a light intensity of the light with a wavelength of 11 nm is the strongest among those, and the light with a wavelength of 11 nm has an intensity of $I_{11.5\ nm}$.

When the light source apparatus's components do not deteriorate, the plasma electron temperature of the plasma PL is a suitable temperature of almost 30 eV. As a result, the 13.5 nm 2% bandwidth light used for the exposure has an enough light intensity required for the exposure, and the other light is absorbed by components that constitutes the exposure apparatus 1. The absorbed light is a heat load for the exposure apparatus 1, and the heat load is set so that a cooling performance of the exposure apparatus 1 may not be exceeded. The properties such as a light intensity angle distribution of the EUV light from the plasma PL becomes a state without non-uniformly illumination on the mask 300.

Figure 18:
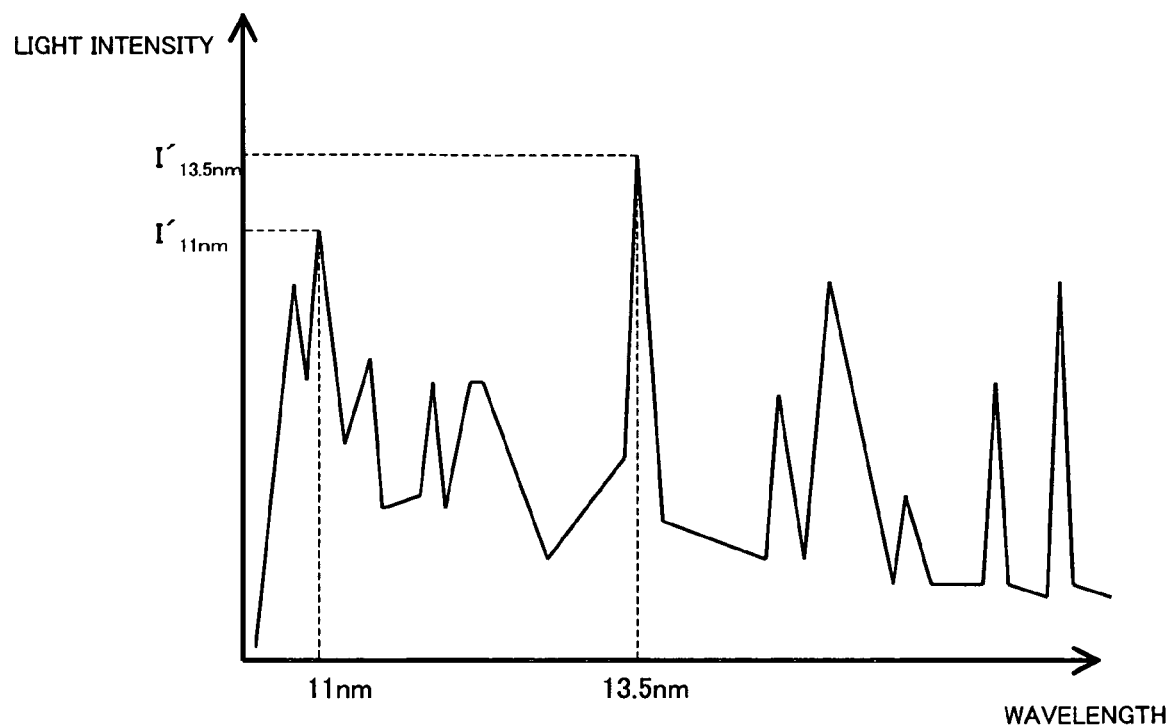
FIG. 18 is a graph of one example of a spectrum detected by the spectrum measuring apparatus shown in FIG. 16.

However, the light source apparatus's components deteriorate, for example, the state of the plasma PL change by changing the form the electrode 114, and the plasma electron temperature of the plasma PL changes. When the plasma electron temperature of the plasma PL becomes lower than the suitable temperature, the peak of 13.5 nm changes to the intensity of $I'_{13.5\ nm}$ and the light with a wavelength of 11 nm changes to the intensity of $I'_{11\ nm}$ as shown in FIG. 18, in the spectrum detected by the spectrum measuring apparatus 170C. In other words, when the plasma electron temperature of plasma PL is lower than the suitable temperature, the intensities becomes $(I'_{11\ nm}/I'_{13.5\ nm})<(I_{11\ nm}/I_{13.5\ nm})$. On the other hands, when the plasma electron temperature of plasma PL is higher than the suitable temperature, the intensities becomes $(I'_{11\ nm}/I'_{13.5\ nm})>(I_{11\ nm}/I_{13.5\ nm})$.

When the plasma electron temperature of the plasma PL is not the suitable temperature, the 13.5 nm 2% bandwidth light does not have an enough intensity required for the exposure. The enough intensity becomes as an excessive heat load for the exposure apparatus 1. The light intensity angle distribution of the EUV light EL form the plasma PL occurs the non-uniformly illumination on the mask 300. Therefore, the performance of the exposure apparatus 1 deteriorates.

The adjusting part 180 calculates (the light intensity of 11 nm/the light intensity of 13.5 nm) from the spectrum of the object light ML detected by the spectrum measuring apparatus 170C. Moreover, the adjusting part 180 compares the calculated result with $(I_{11\ nm}/I_{13.5\ nm})$ for the plasma electron temperature is the suitable temperature. If the compared result is (the light intensity of 11 nm/the light intensity of 13.5 nm)<$(I_{11\ nm}/I_{13.5\ nm})$, the adjusting part 180 judges that the plasma electron temperature is lower than the suitable temperature. Then, the adjusting part 180 increases an applied voltage to the electrode 114 so that the plasma electron temperature of the plasma PL becomes (the light intensity of 11 nm/the light intensity of 13.5 nm)=$(I_{11\ nm}/I_{13.5\ nm})$. On the other hand, if the compared result is (the light intensity of 11 nm/the light intensity of 13.5 nm)>$(I_{11\ nm}/I_{13.5\ nm})$, the adjusting part 180 judges that the plasma electron temperature is higher than the suitable temperature. Then, the adjusting part 180 decreases an applied voltage to the electrode 114 so that the plasma electron temperature of the plasma PL becomes (the light intensity of 11 nm/the light intensity of 13.5 nm)=$(I_{11\ nm}/I_{13.5\ nm})$.

Thus, the adjusting part 180 adjusts the plasma electron temperature of the plasma PL based on plasma property of the EUV light EL in the position between the condenser mirror 130 that condenses the EUV light EL from the plasma PL and the illumination optical system 200. Thereby, plasma electron temperature of the plasma PL is always maintainable the suitable, and the stable exposure is achieved. Not only the light intensities of 11 nm and 13.5 nm but two wavelength that the light intensity ratio changes by changing the plasma electron temperature for the judgment of the plasma electron temperature. For example, the EUV light with other wavelength, ultraviolet light, and visible light may be used for the judgment. Moreover, two wavelength that the light intensity ratio changes by changing the plasma electron temperature may be selected according to the kind of gas which generates plasma PL. The parameter for controlling the plasma electron temperature of the plasma PL is not limited to the applied voltage to the electrode 114, and may be one such as flow rate pf gas that generates the plasma PL that changes the plasma electron temperature.

Figure 19:
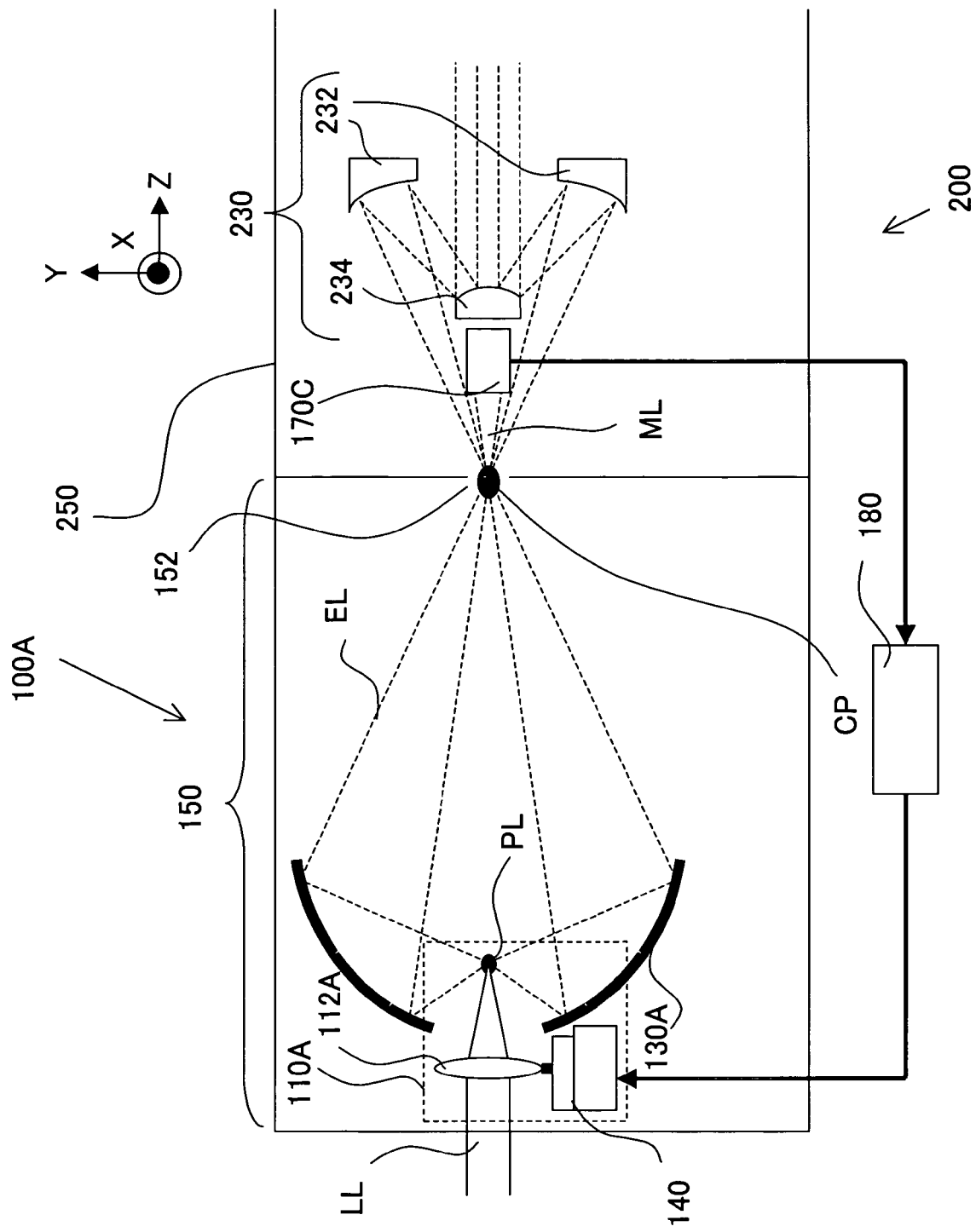
FIG. 19 is a schematic sectional view of a light source apparatus constituted the light source apparatus shown in FIG. 15 as a laser plasma system.

The spectrum measuring apparatus 170C and the adjusting part 180 as the detector 170 are applied to the light source apparatus 100A that uses laser plasma system as shown in FIG. 19. FIG. 19 is a schematic sectional view of the light source apparatus 100A that constitutes the light source apparatus 100 shown in FIG. 15 as the laser plasma system.

In the light source apparatus 100A using the laser plasma system, the nozzle that supplies the target material deteriorates, the plasma electron temperature of the plasma PL changes by changing the supplied target material density. Referring to FIG. 19, a light is not incident upon the Schwarzschild mirror 230 of the illumination optical system 200 among the EUV light EL from the condensing point CP is incident upon the spectrum measuring apparatus 170C as the object light ML.

Figure 20:
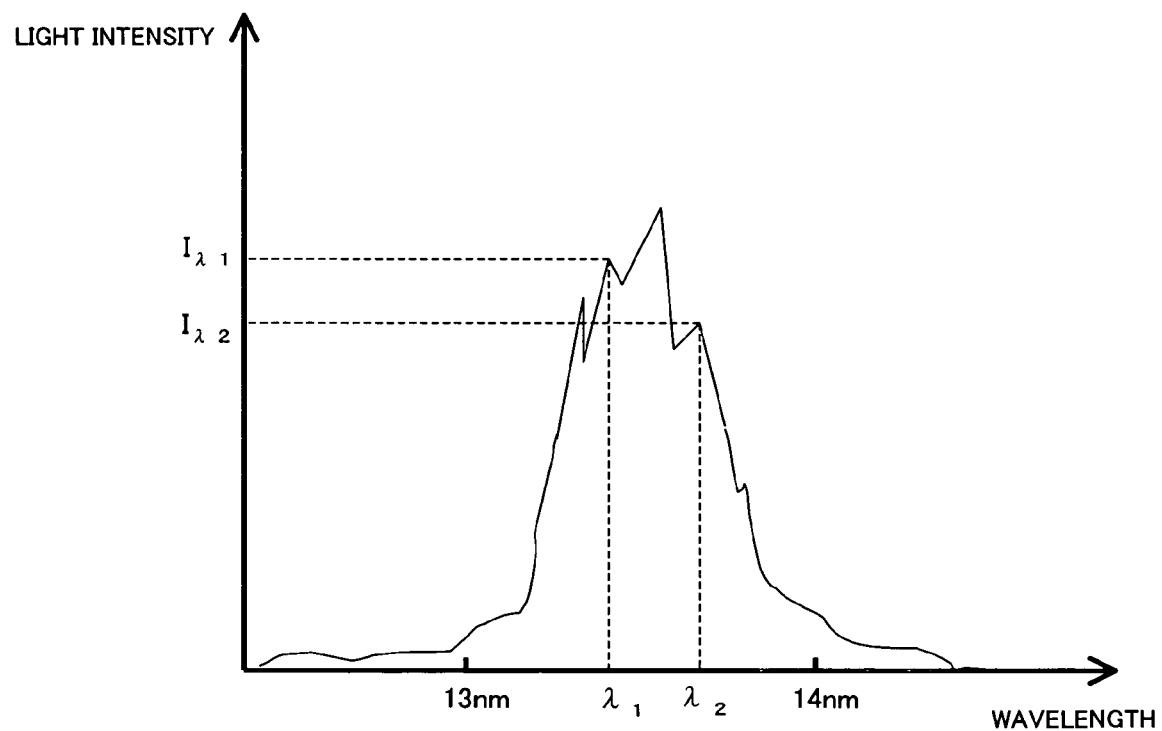
FIG. 20 is a graph of one example of a spectrum detected by the spectrum measuring apparatus shown in FIG. 19.

The spectrum of the object light ML detected by the spectrum measuring apparatus 170C multiplies, as shown in FIG. 20, the EUV light EL from the plasma PL by the reflectance of the condenser mirror 130. Therefore, only the wavelength component near the 13.5 nm exists in the wavelength region of the EUV light, and plural emission lines according to plural energy transitions exist.

The adjusting part 180 judges whether the plasma electron temperature of the plasma PL is the suitable temperature based on the spectrum of the object light ML (in the other words, the ratio of two among the plural emission lines) detected by the spectrum measuring apparatus 170C. Referring to FIG. 20, it is considered that a light intensity in a wavelength $\lambda_1$ assumes to $I_{\lambda 1}$, a light intensity in a wavelength $\lambda_2$ assumes to $I_{\lambda,2}$, and $\lambda_1 < \lambda_2$. If the light intensity is $(I_{\lambda,1}/I_{\lambda,2})$ <(the light intensity of the wavelength $\lambda_1$) in the suitable plasma electron temperature, the adjusting part 180 judges that the plasma electron temperature is lower than the suitable temperature. On the other hand, if the light intensity is $(I_{\lambda,1}/I_{\lambda,2})$>(the light intensity of the wavelength $\lambda_1$) in the suitable plasma electron temperature, the adjusting part 180 judges that the plasma electron temperature is higher than the suitable temperature. Moreover, when the adjusting part 180 judges that the plasma electron temperature is lower than the suitable temperature, moves the laser condensing optical system 112A in the Z-axis direction via the stage 140. Thereby, a condensing area of the laser beam LL on the target material becomes small, a power density of the laser beam BB decreases, and the plasma electron temperature of the plasma PL becomes high. On the other hands, when the adjusting part 180 judges that the plasma electron temperature is higher than the suitable temperature, moves the laser condensing optical system 112A in the Z-axis direction via the stage 140. Thereby, the condensing area of the laser beam LL on the target material becomes large, the power density of the laser beam BB increases, and the plasma electron temperature of the plasma PL becomes low.

The light source apparatus 100A corrects the plasma electron temperature of the plasma PL based on the spectrum property of the EUV light EL in the position between the condenser mirror 130A that condenses the EUV light EL from the plasma PL and the illumination optical system 200, and can maintain the plasma electron temperature of the plasma PL to the suitable temperature. The parameter for controlling the plasma electron temperature of the plasma PL is not limited to the power density of the laser beam LL, and may be one such as a pulse width of laser beam LL that changes the plasma electron temperature.

The light source apparatuses 100 and 100A detects the properties of the EUV light EL in the position between the condenser mirrors 130 or 130A that condenses the EUV light EL from the plasma PL and the illumination optical system 200. The light source apparatus 100 can stably and uniformly illuminate the mask 300 by correcting the state of the plasma PL based on the detected result. Here, the properties of the EUV light EL is, for example, the position of the condensing point CP, the light intensity of the EUV light EL in the condensing point CP, the light intensity distribution within the divergence angle divergent from the condensing point CP, and the spectrum.

Turning back to FIG. 1, the illumination optical system 200 is an optical system that illuminates the mask 300, includes, as above-mentioned, the illumination system mirror 210, the optical integrator 220, and the Schwarzschild mirror 230. The illumination optical system 200 further may include an aperture to limit the illumination area to an arc shape at a position conjugate with the mask 300.

The mask 300 is a reflection mask, and has a circuit pattern (or image) to be transferred. The mask 300 is supported and driven by the mask stage 400. The diffracted light emitted from the mask 300 is projected onto the object 600 after reflected by the projection optical system 500. The mask 300 and the object 600 are arranged optically conjugate with each other. Since the exposure apparatus 1 is a scanner, the mask 300 and object 600 are scanned to transfer a reduced size of a pattern of the mask 300 onto the object 600.

The mask stage 400 supports the mask 300 and is connected to a moving mechanism (not shown). The mask stage 400 may use any structure known in the art. The moving mechanism (not shown) may includes a linear motor etc., and drives the mask stage 400 at least in a direction X and moves the mask 300. The exposure apparatus 1 synchronously scans the mask 300 and the object 600. The exposure apparatus 1 assigns the direction X to scan the mask 300 or the object 600, a direction Y perpendicular to the direction X, and a direction Z perpendicular to the mask 300 or the object 600.

The projection optical system 500 uses plural mirrors (in other words, plural multilayer film mirrors) 510 to project a reduce size of a pattern of the mask 300 onto the object 600. The number of mirrors 510 is about four to six. For wide exposure area with the small number of mirrors, the mask 300 and object 600 are simultaneously scanned to transfer a wide area that is an arc-shape area or ring field apart from the optical axis by a predetermined distance. The projection optical system 500 has a NA of about 0.2 to 0.3.

The instant embodiment uses a wafer as the object 600 to be exposed, but it may include a spherical semiconductor and liquid crystal plate and a wide range of other objects to be exposed. Photoresist is applied onto the object 600.

The object 600 to be exposed is held by the wafer stage 700 by a wafer chuck. The wafer stage 700 moves the object 600, for example, using a linear motor in XYZ directions. The mask 300 and the object 600 are synchronously scanned. The positions of the mask stage 400 and wafer stage 700 are monitored, for example, by a laser interferometer, and driven at a constant speed ratio.

The alignment detecting mechanism 800 measures a positional relationship between the position of the mask 300 and the optical axis of the projection optical system 500, and a positional relationship between the position of the object 600 and the optical axis of the projection optical system 500, and sets positions and angles of the mask stage 400 and the wafer stage 700 so that a projected image of the mask 300 may accord with the object 600.

The focus position detecting mechanism 900 measures a focus position on the object 600 surface, and controls over a position and angle of the wafer stage 700 always maintains the object 600 surface at an imaging position of the projection optical system 500 during exposure.

In exposure, the EUV light EL emitted from the light source apparatus 100 illuminates the mask 300, and images a pattern of the mask 300 onto the object 600 surface. The instant embodiment uses an arc or ring shaped image plane, scans the mask 300 and object 600 at a speed ratio corresponding to a reduction rate to expose the entire surface of the mask 300. The light source apparatus 100 used for the exposure apparatus 1 can stably provide the EUV light EL to uniformly illuminate the mask 300. Therefore, the exposure apparatus 300 achieves an excellent exposure performance, and provides devices (such as semiconductor devices, LCD devices, image pickup devices (e.g., CCDs), and thin film magnetic heads) with a high throughput and good economical efficiency.

Figure 21:
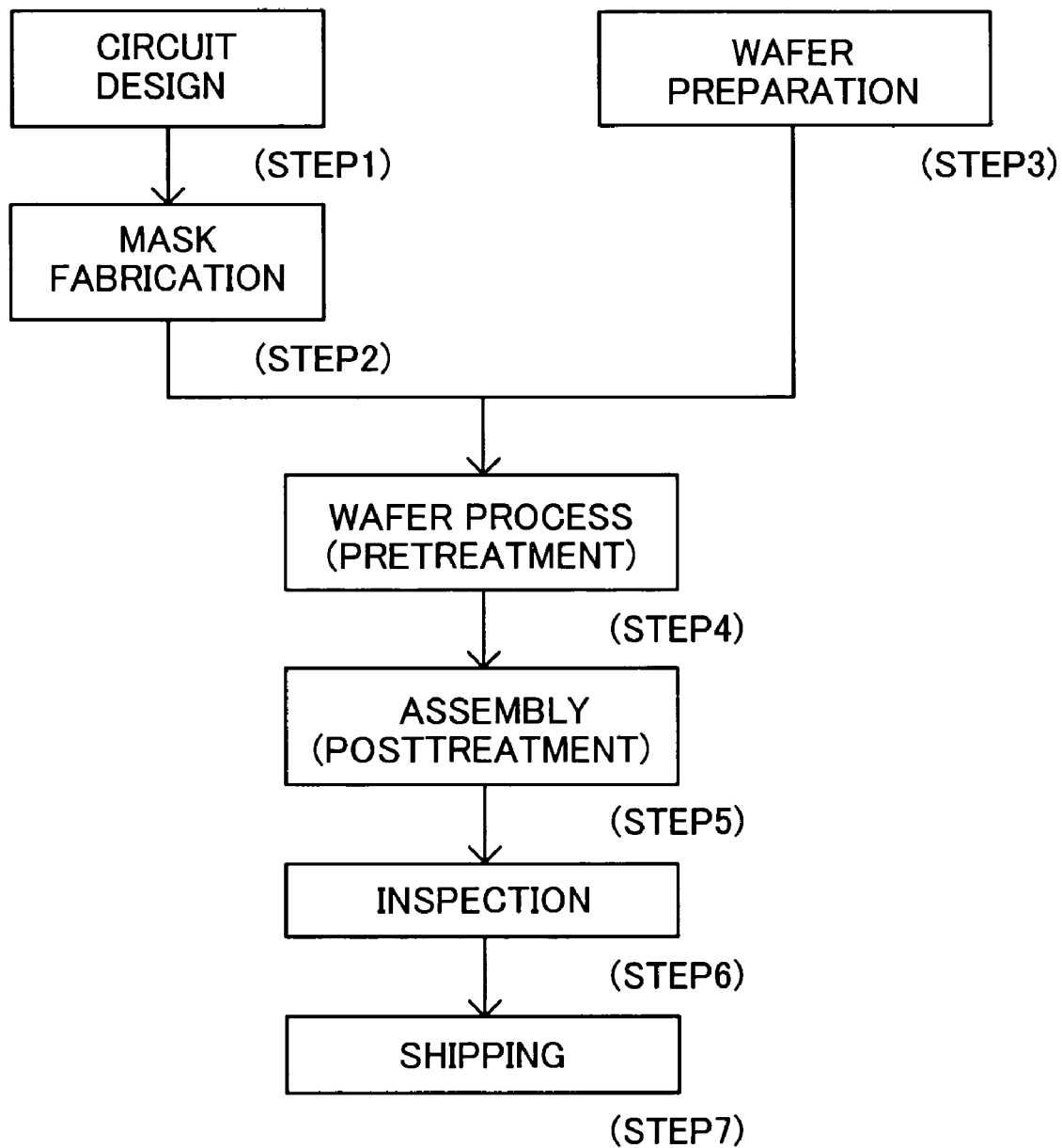
FIG. 21 is a flowchart for explaining how to fabricate devices (such as semiconductor chips such as ICs, LCDs, CCDs, and the like)
Figure 22:
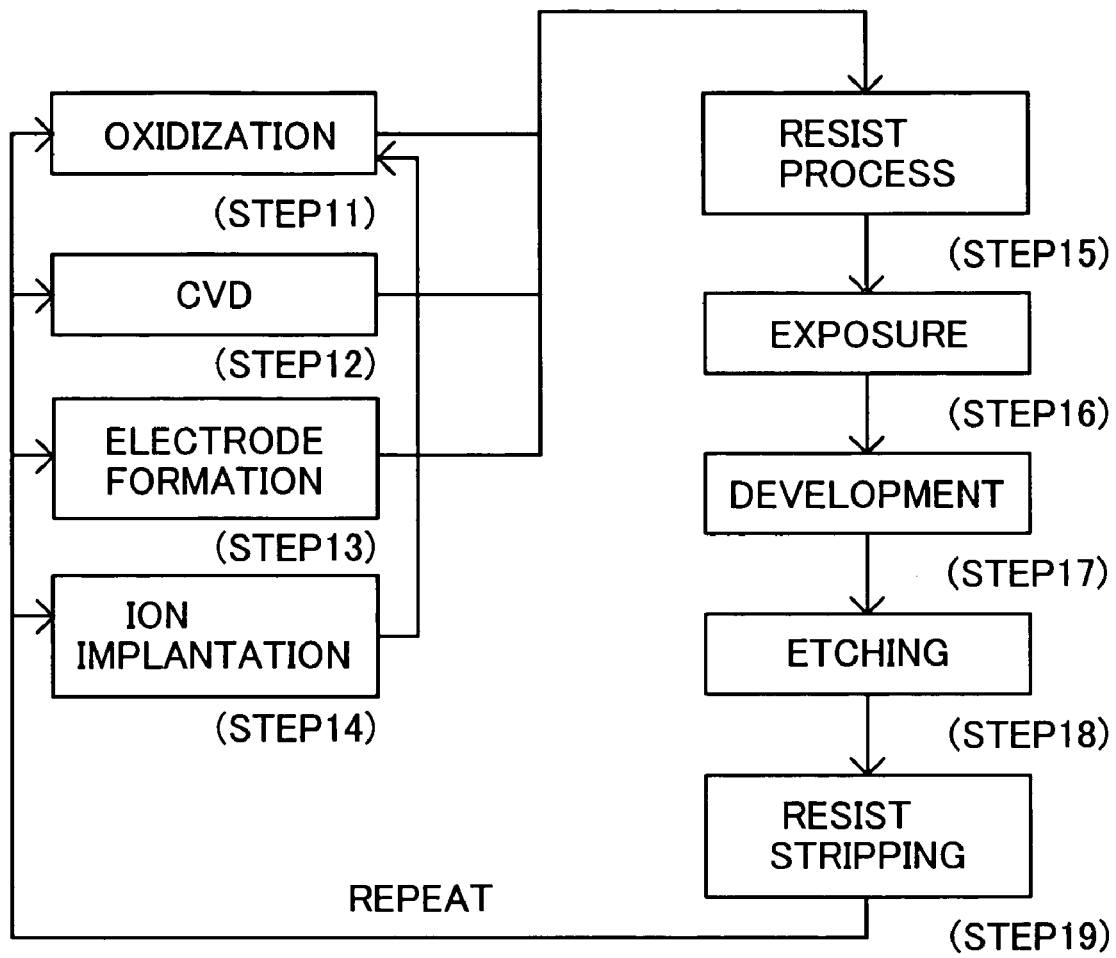
FIG. 22 is a detail flowchart of a wafer process in Step 4 of FIG. 21.

Referring now to FIGS. 21 and 22, a description will be given of an embodiment of a device fabrication method using the above mentioned exposure apparatus 1. FIG. 21 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 22 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1 to expose a circuit pattern from the mask onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device fabrication method of this embodiment may manufacture higher quality devices than the conventional one. Thus, the device fabrication method using the exposure apparatus 1, and resultant devices constitute one aspect of the present invention.

Furthermore, the present invention is not limited to these preferred embodiments and various variations and modifications may be made without departing from the scope of the present invention.

This application claims a foreign priority benefit based on Japanese Patent Application No. 2004-313484, filed on Oct. 28, 2004, which is hereby incorporated by reference herein in its entirety as if fully set forth herein.

What is claimed is:

1. An exposure apparatus for exposing a pattern of a mask onto an object, said exposure apparatus comprising:
    a light source for generating a plasma, said light source including a condenser mirror that condenses a light irradiated from the plasma;
    an illumination optical system for illuminating the mask using the light condensed by the condenser mirror;
    a detector that is provided between the condenser mirror and the illumination optical system, said detector detecting a property of the light; and
    a changing part for changing a state of the plasma based on a detected result of the detector.

2. An exposure apparatus according to claim 1, wherein said property of the light is at least one of a position of a condensing point of the light, a light intensity distribution within a divergence angle divergent from the condensing point, a spectrum of the light, and a light intensity on the condensing point.

3. An exposure apparatus according to claim 1, wherein said changing part changes at least one of a position of the plasma and an electron temperature of the plasma.

4. An exposure apparatus according to claim 1, wherein said detector detects the property of the light at a predetermined time interval.

5. An exposure apparatus according to claim 1, wherein said detector always detects the property of the light when the plasma is generated.

6. An exposure apparatus according to claim 1, wherein said detector is provided between a condensing point of the light and the illumination optical system.

7. An exposure apparatus according to claim 1, wherein said light has a wavelength of 20 nm or less.

* * * * *